United States Patent [19]

Okamoto et al.

[11] Patent Number: 5,801,212

[45] Date of Patent: Sep. 1, 1998

[54] PHOTOPOLYMERIZABLE COMPOSITION CONTAINING A SENSITIZING DYE AND A TITANOCENE COMPOUND

[75] Inventors: Yasuo Okamoto; Shunichi Kondo, both of Shizuoka, Japan

[73] Assignee: Fuji Photo Film Co., Ltd., Minami-ashigara, Japan

[21] Appl. No.: 668,612

[22] Filed: Jun. 4, 1996

[30] Foreign Application Priority Data

Jun. 7, 1995 [JP] Japan .................. 7-164583

[51] Int. Cl.$^6$ .............. C08F 2/50; G03C 1/675; G03C 1/735
[52] U.S. Cl. .............. 522/16; 522/18; 522/24; 522/25; 522/26; 522/29; 522/28; 522/121; 430/286.1; 430/281.1
[58] Field of Search .............. 522/16, 18, 26, 522/29, 28, 25, 24, 121

[56] References Cited

U.S. PATENT DOCUMENTS 5,011,755  4/1991  Rohde et al. .................. 522/29
5,609,992  3/1997  Sorori et al. .................. 430/281.1

FOREIGN PATENT DOCUMENTS 63-258903  10/1988  Japan .

*Primary Examiner*—Susan W. Berman
*Attorney, Agent, or Firm*—Burns, Doane, Swecker & Mathis, LLP

[57] ABSTRACT

A photopolymerizable composition comprising an addition-polymerizable compound having at least one ethylenic unsaturated double bond, a specific sensitizing dye represented by the following formula (I), and a titanocene compound:

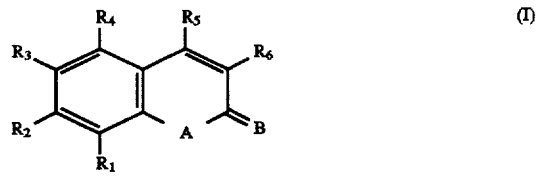

The substituents in formula (I) are defined in the specification.

5 Claims, No Drawings

PHOTOPOLYMERIZABLE COMPOSITION CONTAINING A SENSITIZING DYE AND A TITANOCENE COMPOUND

FIELD OF THE INVENTION

The present invention relates to a photopolymerizable composition. More particularly, the present invention relates to a photopolymerizable composition highly sensitive to light rays in the visible light region and capable of showing good sensitivity also to a laser light, for example, $Ar^+$ laser and YAG-SHG laser.

BACKGROUND OF THE INVENTION

A large number of image formation methods using a photopolymerization system have been conventionally known and used over a wide range of fields such as printing plate, printed circuit, paint, ink, hologram recording and three dimensional formation. For example, there are known a method where a photopolymerizable composition comprising an addition-polymerizable compound having an ethylenic double bond and a photopolymerization initiator, furthermore, if desired, an organic high molecular binder and a thermal polymerization inhibitor is provided on a support to form a film layer, the layer is imagewise exposed to a desired image to cure the exposed area by polymerization and then the unexposed area is removed by dissolution to form a cured relief image, a method where a layer comprising the above-described photopolymerizable composition is provided between two supports, with at least one support being transparent, the layer is imagewise exposed from the transparent support side to induce the change in adhesive strength by light and then the support is peeled off to form an image, a method where a photosensitive material having a microcapsule layer containing a photopolymerizable composition and a coloring material such as a leuco dye is prepared, the photosensitive material is imagewise exposed to photocure capsules on the exposed area, the capsules on the unexposed area are ruptured by pressure or heat treatment, the coloring material dissolved out is put into contact with the coloring material developer to effect coloration to thereby form a colored image, an image formation method using the change in toner adhesion property of the photopolymerizable composition due to light and an image formation method using the change in refractive index of the photopolymerizable composition.

The photopolymerizable composition applied to these methods uses in many cases benzyl, benzoin ether, Michler's ketone, anthraquinone, acridine, phenazine or benzophenone as a photopolymerization initiator. However, these photopolymerization initiators are extremely low in the photopolymerization initiation ability to visible light of 400 nm or more as compared with the photopolymerization initiation ability to ultraviolet light of 400 nm or less and accordingly, they are remarkably limited in their application range.

Recently, as the image formation technique has been developed, a photopolymer having high sensitivity to light rays in the visible region is being demanded. The photopolymer is, for example, a photosensitive material suitable for non-contact type plate making using projection exposure or for plate making using a visible light laser. Highly expected as a visible light laser are $Ar^+$ laser which emits light of 488 nm and a YAG-SHG laser which emits light of 532 nm.

With respect to the photopolymerization initiation system sensitive to light rays in the visible light region, many proposals have been hitherto made. Examples of the system include a certain kind of photosensitive dyes described in U.S. Pat. No. 2,850,445, a composite initiation system of a dye and an amine (JP-B-44-20189 (the term "JP-B" as used herein means an "examined Japanese patent publication")), a combination use system of hexaarylbiimidazole, a radical generating agent and a dye (JP-B-45-37377), a system of hexaarylbiimidazole and p-dialkylaminobenzylidene ketone (JP-B-47-2528, JP-A-54-155292 (the term "JP-A" as used herein means an "unexamined published Japanese patent application")), a system of a cyclic cis-α-dicarbonyl compound and a dye (JP-A-54-84183), a system of a substituted triazine and a merocyanine dye (JP-A-54-151024), a system of 3-ketocoumarin and an activator (JP-A-52-112681, JP-A-58-15503), a system of biimidazole, a styrene derivative and a thiol (JP-A-59-140203), a system of an organic peroxide and a dye (JP-A-59-140203, JP-A-59-189340) and a system of a dye having a rhodanine skeleton and a radical generating agent (JP-A-2-244050).

The titanocene is effective as a photopolymerization initiator, which is described in JP-A-59-152396, JP-A-61-151197, JP-A-63-10602, JP-A-63-41484 and JP-A-3-12403. Examples of the combination use system thereof include a system of titanocene and a 3-ketocoumarin dye (JP-A-63-221110), a system where titanocene, a xanthene dye and furthermore, an addition-polymerizable ethylenic unsaturated compound containing an amino group or a urethane group are used in combination (JP-A-4-221958, JP-A-4-219756) and a system of titanocene and a specific merocyanine dye (JP-A-6-295061).

These conventional techniques are surely effective to visible light rays; however, they are bound to problems such that the sensitivity is insufficient or even if high sensitivity is achieved, the storage stability is poor and hence, these systems cannot be used in practice.

SUMMARY OF THE INVENTION

An object of the present invention is to provide a highly sensitive photopolymerizable composition.

Another object of the present invention is to provide a photopolymerizable composition highly sensitive to visible light rays of 400 nm or more and to light of 488 nm or 532 nm corresponding to the output of an $Ar^+$ laser or YAG-SHG laser, respectively.

A further object of the present invention is to provide a photopolymerizable composition excellent in storage stability.

The present inventors have found that a combination use system of a dye having a specific structure and a titanocene compound capable of generating active radicals upon light irradiation in the presence of the sensitizing dye exhibits very high sensitivity to the visible light rays of 400 nm or more and is excellent in storage stability. Based on this finding, the present invention has been accomplished.

More specifically, these and other objects of the present invention have been attained by a photopolymerizable composition comprising an addition-polymerizable compound having at least one ethylenic unsaturated double bond, a sensitizing dye represented by the following formula (I) and a titanocene compound:

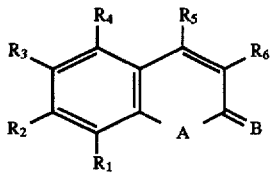

wherein $R_1$, $R_2$, $R_3$ and $R_4$ are the same or different, and each represents a hydrogen atom, a halogen atom, a substituted or unsubstituted alkyl group, a substituted or unsubstituted aryl group, a hydroxyl group, a substituted or unsubstituted alkoxy group, or a substituted or unsubstituted amino group, or $R_1$, $R_2$, $R_3$ or $R_4$ may be combined with a carbon atom in formula (I) to form a nonmetallic atom ring; $R_5$ represents a hydrogen atom, a substituted or unsubstituted alkyl group, a substituted or unsubstituted aryl group, a substituted or unsubstituted heteroaromatic group, a cyano group, a substituted or unsubstituted alkoxy group, a carboxyl group, or a substituted or unsubstituted alkenyl group; $R_6$ has the same meaning as $R_5$ or represents —Z—$R_5$, in which Z represents a carbonyl group, a sulfonyl group, a sulfinyl group or an arylenedicarbonyl group, or $R_5$ and $R_6$ may be combined with each other to form a nonmetallic atom ring; A represents O, S, NH, or a nitrogen atom having a substituent; and B represents an oxygen atom or a group represented by the following formula:

wherein $G_1$ and $G_2$ are the same or different, and each represents a hydrogen atom, a cyano group, a substituted or unsubstituted alkoxycarbonyl group, a substituted or unsubstituted aryloxycarbonyl group, a substituted or unsubstituted acyl group, a substituted or unsubstituted arylcarbonyl group, a substituted or unsubstituted alkylthio group, a substituted or unsubstituted arylthio group, a substituted or unsubstituted alkylsulfonyl group, a substituted or unsubstituted arylsulfonyl group, or a fluorosulfonyl group, provided that $G_1$ and $G_2$ are not a hydrogen atom at the same time, or $G_1$ and $G_2$ may be combined with each other to form a nonmetallic atom group together with a carbon atom.

DETAILED DESCRIPTION OF THE INVENTION

Preferably, the photopolymerization initiation system further contains at least one compound selected from the group consisting of the following compounds (1) to (8):

(1) a compound having a carbon-halogen bond;

(2) a ketone compound represented by the following formula (II):

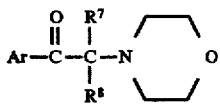

wherein $R^7$ and $R^8$ are the same or different, and each represents a hydrogen atom or a substituted or unsubstituted alkyl group, or $R^7$ and $R^8$ may be combined with each other to form a carbon ring with a carbon atom; and Ar represents an aromatic group selected from the following formulae:

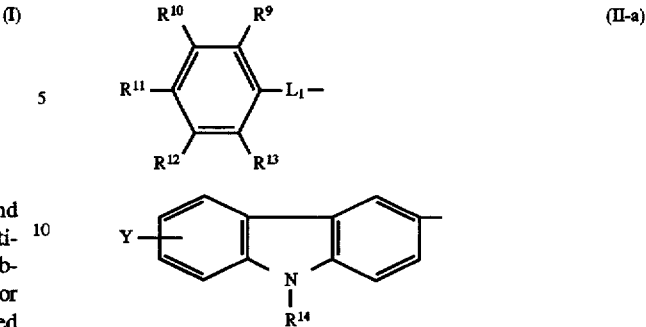

wherein $R^9$, $R^{10}$, $R^{11}$, $R^{12}$ and $R^{13}$ are the same or different, and each represents a hydrogen atom, a halogen atom, a substituted or unsubstituted alkyl group, a substituted or unsubstituted alkenyl group, a substituted or unsubstituted aryl group, a hydroxyl group, a substituted or unsubstituted alkoxy group, an —S—$R^{15}$ group, an —SO—$R^{15}$ group or an —SO$_2$—$R^{15}$ group, provided that at least one of $R^9$, $R^{10}$, $R^{11}$, $R^{12}$ and $R^{13}$ represents an —S—$R^{15}$ or —SO—$R^{15}$ group, in which $R^{15}$ represents a hydrogen atom, a substituted or unsubstituted alkyl group, a substituted or unsubstituted acyl group, a substituted or unsubstituted aryl group or a substituted or unsubstituted alkenyl group; $L_1$ represents a single bond or a substituted or unsubstituted alkylene group; $R^{14}$ represents a hydrogen atom, a substituted or unsubstituted alkyl group or a substituted or unsubstituted acyl group; and Y represents a hydrogen atom or

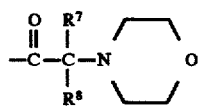

wherein $R^7$ and $R^8$ have the same meanings as the above-described $R^7$ and $R^8$;

(3) a ketoxime compound represented by the following formula (III):

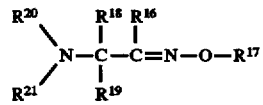

wherein $R^{16}$ and $R^{17}$ are the same or different, and each represents a substituted or unsubstituted hydrocarbon group which may contain an unsaturated bond or a substituted or unsubstituted heterocyclic group; $R^{18}$ and $R^{19}$ are the same or different, and each represents a hydrogen atom, a substituted or unsubstituted hydrocarbon group which may contain an unsaturated bond, a substituted or unsubstituted heterocyclic group, a hydroxyl group, a substituted oxy group, a mercapto group or a substituted thio group; and $R^{20}$ and $R^{21}$ are the same or different, and each represents a hydrogen atom, a substituted or unsubstituted hydrocarbon group which may contain an unsaturated bond, or a substituted carbonyl group, or $R^{20}$ and $R^{21}$ may be combined with each other to form a ring and represent an alkylene group having from 2 to 8 carbon atoms which may contain —O—, —NR$^{20}$—, —NR$^{21}$—, —O—CO—, —NH—CO—, —S— and/or —SO$_2$— in the linking main chain of the ring;

(4) an organic peroxide;

(5) a thio compound represented by the following formula (IV):

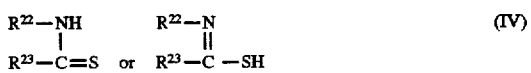

$$\begin{array}{ccc} R^{22}-NH & R^{22}-N & \text{(IV)} \\ | & || & \\ R^{23}-C=S & \text{or} \quad R^{23}-C-SH & \end{array}$$

wherein $R^{22}$ represents a substituted or unsubstituted alkyl group, or a substituted or unsubstituted aryl group; and $R^{23}$ represents a hydrogen atom or a substituted or unsubstituted alkyl group, or $R^{22}$ and $R^{23}$ may be combined with each other to represent a nonmetallic atom group necessary for forming a 5-, 6- or 7-membered ring which may contain a hetero atom selected from an oxygen atom, a sulfur atom and a nitrogen atom;

(6) hexaarylbiimidazole;

(7) an aromatic onium salt; and (8) a ketoxime ester.

The photopolymerizable composition of the present invention comprises an addition-polymerizable compound and a photopolymerization initiation system.

The addition-polymerizable compound (polymerizable compound having an addition-polymerizable unsaturated bond) for use in the present invention is selected from compounds having at least one, preferably two or more, terminal ethylenic unsaturated bond(s) (hereinafter often referred to as an "ethylenic compound").

For example, the compound has a chemical form such as a monomer, a prepolymer, namely, a dimer, a trimer or an oligomer, a mixture of these or a copolymer thereof. Examples of the monomer and the copolymer thereof include an ester of an unsaturated carboxylic acid (e.g., acrylic acid, methacrylic acid, itaconic acid, crotonic acid, isocrotonic acid, maleic acid) with an aliphatic polyhydric alcohol compound and an amide of an unsaturated carboxylic acid with an aliphatic polyamine compound.

Specific examples of the monomer for the ester of an aliphatic polyhydric alcohol compound with an unsaturated carboxylic acid include:

acrylic esters, such as ethylene glycol diacrylate, triethylene glycol diacrylate, 1,3-butandiol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer;

methacrylic esters, such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetra-methacrylate, bis[p-(3-methacryloxy-2-hydroxypropoxy)-phenyl] dimethylmethane and bis[p-(methacryloxyethoxy)-phenyl]dimethylmethane;

itaconic esters, such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

crotonic esters, such as ethylene glycol dicrotonate, tetramethylene glycol dicrotonate, pentaerythritol dicrotonate and sorbitol tetradicrotonate;

isocrotonic esters, such as ethylene glycol diisocrotonate, pentaerythritol diisocrotonate and sorbitol tetraisocrotonate;

maleic esters, such as ethylene glycol dimaleate, triethylene glycol dimaleate, pentaerythritol dimaleate and sorbitol tetramaleate; and mixtures of these ester monomers.

Specific examples of the monomer for the amide of an aliphatic polyamine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriamine-trisacrylamide, xylylenebisacrylamide and xylylenebis-methacrylamide.

Other examples include a vinylurethane compound having two or more polymerizable vinyl groups per one molecule resulting from adding a vinyl monomer having a hydroxyl group represented by the following formula (A) to a polyisocyanate compound having two or more isocyanate groups per one molecule described in JP-B-48-41708:

$$CH_2=C(R)COOCH_2CH(R')OH \quad \text{(A)}$$

wherein R and R' each represents H or $CH_3$.

Furthermore, polyfunctional acrylates and methacrylates such as urethane acrylates as described in JP-A-51-37193, polyester acrylates as described in JP-A-48-64183, JP-B-49-43191 and JP-B-52-30490, and epoxy acrylates resulting from reacting an epoxy resin with a (meth)acrylic acid may be used. Also, photo-curable monomers and oligomers described in Nippon Secchaku Kyokai-shi (Journal of Japan Adhesion Society), vol. 20, No. 7, pp. 300–308 (1984) may be used. The use amount of the compound is from 5 to 50% by weight (hereinafter simply referred to as "%", preferably from 10 to 40%, based on the entire components.

Next, the photopolymerization initiation system for use in the photopolymerization composition of the present invention will be described below. The photopolymerization initiation system comprises a combination of at least two components. The first component thereof is a sensitizing dye represented by formula (I). The sensitizing dye represented by formula (I) will be explained below.

In formula (I), $R_1$ to $R_4$ each independently represents a hydrogen atom, a halogen atom, an alkyl group, a substituted alkyl group, an aryl group, a substituted aryl group, a hydroxyl group, an alkoxy group, a substituted alkoxy group, an amino group, or a substituted amino group. Also, $R_1$ to $R_4$ each may be combined with a carbon atom in formula (I) to form a nonmetallic atom ring.

$R_5$ represents a hydrogen atom, an alkyl group, a substituted alkyl group, an aryl group, a substituted aryl group, a heteroaromatic group, a substituted heteroaromatic group, a cyano group, an alkoxy group, a substituted alkoxy group, a carboxyl group, an alkenyl group, or a substituted alkenyl group. $R_6$ has the same meaning as $R_5$ or represents —Z—$R_5$, in which Z represents a carbonyl group, a sulfonyl group, a sulfinyl group, or an arylenedicarbonyl group, provided that $R_5$ and $R_6$ are the same or different. Also, $R_5$ and $R_6$ may be combined with each other to form a nonmetallic atom ring.

A represents O, S, NH, or a nitrogen atom having a substituent; B represents an oxygen atom or a group represented by $=CG_1(G_2)$, in which $G_1$ and $G_2$ are the same or different, and each represents a hydrogen atom, a cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, a substituted alkylthio group, an arylthio group, a substituted arylthio group, an alkylsulfonyl group, a substituted alkylsulfonyl group, an arylsulfonyl group, a substituted arylsulfonyl group, or a fluorosulfonyl group, provided that $G_1$ and $G_2$ are not a hydrogen atom at the same time. Also, $G_1$ and $G_2$ may be combined with a carbon atom in $=CG_1(G_2)$ to form a nonmetallic ring.

Examples of the alkyl group represented by $R_1$ to $R_5$ include an alkyl group having from 1 to 20 carbon atoms such as methyl, ethyl and t-butyl. Examples of the aryl group represented by $R_1$ to $R_5$ include an aryl group having from 6 to 10 carbon atoms such as phenyl. Examples of the alkoxy group represented by $R_1$ to $R_5$ include an alkoxy group having from 1 to 6 carbon atoms such as methoxy, ethoxy and butoxy. Examples of the substituted amino group represented by $R_1$ to $R_4$ include alkylamino and arylamino groups having from 1 to 20 carbon atoms such as methylamino, dimethylamino, diethylamino, diphenylamino, piperidino and morpholino.

The alkyl, aryl, alkoxy, alkylamino and arylamino groups may be substituted with at least one substituent. Examples of the substituent include a halogen atom (e.g., fluorine, chlorine, bromine), an alkoxycarbonyl group (e.g., ethoxycarbonyl), an alkoxy group (e.g., methoxy, ethoxy), an aryl group (e.g., phenyl), and a cyano group.

If $R_1$ to $R_4$ are combined with a carbon atom to form a nonmetallic ring, examples of the sensitizing dye represented by formula (I) containing the nonmetallic ring include structures represented by the following formulae (A), (B) and (C):

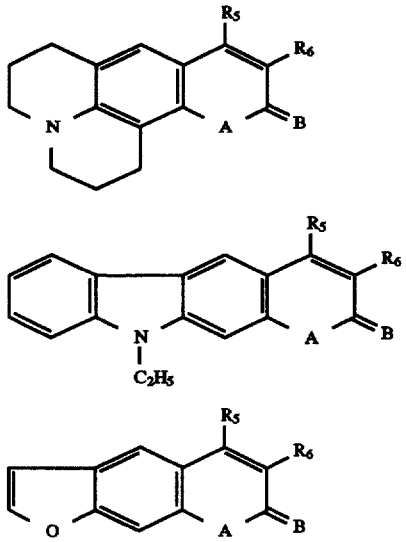

Examples of the alkenyl group represented by $R_5$ include an alkenyl group having from 2 to 10 carbon atoms such as styryl. Examples of the heteroaromatic group represented by $R_5$ include groups represented by the following formulae (D) to (H):

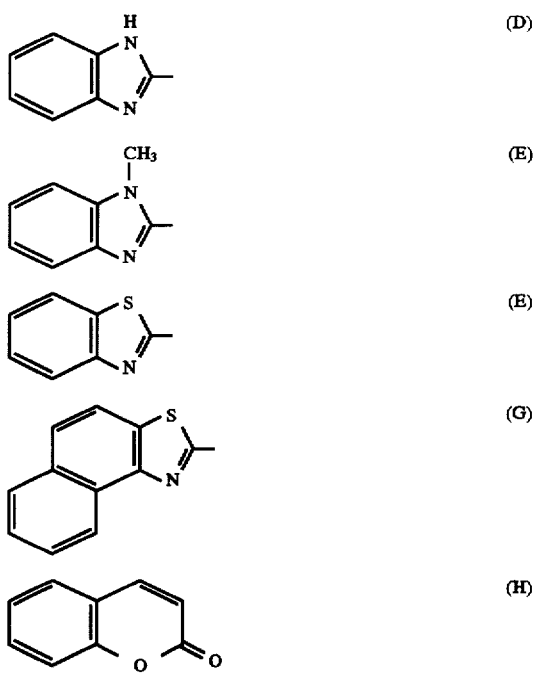

The heteroaromatic group represented by $R_5$ may be substituted with at least one substituent. Examples of the substituent include a halogen atom (e.g., fluorine, chlorine, bromine), alkylamino and arylamino groups having from 1 to 20 carbon atoms (e.g., dimethylamino, diethylamino, diphenylamino), an alkyl group having from 1 to 20 carbon atoms, and an alkoxy group having from 1 to 6 carbon atoms. Also, $R_5$ and $R_6$ may be combined with a carbon atom to form a nonmetallic ring, and the examples thereof include a structure represented by the following formula (J):

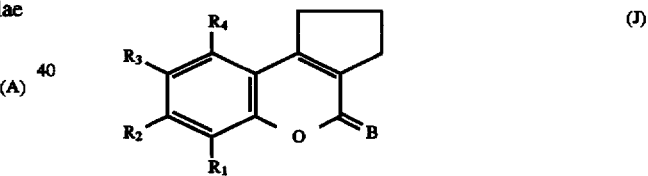

If A is a nitrogen atom having a substituent, examples of the substituent include those defined with regard to $R_1$ to $R_5$ (e.g., alkyl, aryl).

B represents an oxygen atom or a group represented by $=CG_1(G_2)$, in which $G_1$ and $G_2$ are the same or different, and preferably each represents a hydrogen atom, a cyano group, an alkoxycarbonyl group having an alkyl group having from 1 to 10 carbon atoms (e.g., ethoxycarbonyl), an aryloxycarbonyl group having an aryl group having from 6 to 10 carbon atom (e.g., phenoxycarbonyl), an acyl group having from 1 to 6 carbon atoms (e.g., acetyl, propionyl), an arylcarbonyl group having from 7 to 11 carbon atoms (e.g., benzoyl), an alkylthio group having from 1 to 6 carbon atoms (e.g., methylthio, ethylthio), an arylsulfonyl group having from 6 to 10 carbon atoms (e.g., phenylsulfonyl), an alkylsulfonyl group having from 1 to 6 carbon atoms (e.g., methylsulfonyl, ethylsulfonyl), and a fluorosulfonyl group.

The alkoxycarbonyl, aryloxycarbonyl, acyl, arylcarbonyl, alkylthio, arylthio, arylsulfonyl, and alkylsulfonyl groups may be substituted with at least one substituent. Examples of the substituent include a halogen atom (e.g., chlorine), an alkoxycarbonyl group having an alkyl group having from 1 to 6 carbon atoms, a carboxyl group, an aryl group having from 6 to 10 carbon atoms, an alkoxy group having from 1 to 6 carbon atoms, and a cyano group. Also, the aryloxy-carbonyl, arylcarbonyl, arylthio, and arylsulfonyl groups may be substituted with an alkyl group(s) having from 1 to 6 carbon atoms such as methyl in addition to the above-described substituents.

If $G_1$ and $G_2$ may be combined with a carbon atom to form a nonmetallic ring, the ring includes acidic nuclei which are generally used as merocyanine dyes. Examples thereof include the following:

(a) 1,3-dicarbonyl nuclei, such as 1,3-indandione, 1,3-cyclohexanedione, 5,5-dimethyl-1,3-cyclohexanedione, and 1,3-dioxane-4,6-dione;

(b) pyrazolinone nuclei, such as 3-methyl-1-phenyl-2-pyrazolin-5-one, 1-phenyl-2-pyrazolin-5-on, and 1-(2-benzo-thiazolyl)-3-methyl-2-pyrazolin-5-one;

(c) isoxazolinone nuclei, such as 3-phenyl-2-isoxazolin-5-one, and 3-methyl-2-isoxazolin-5-one;

(d) oxyindole nuclei, such as 1-alkyl-2,3-dihydro-2-oxyindole;

(e) 2,4,6-triketohexahydropyrimidine nuclei, such as barbituric acid, 2-thiobarbituric acid, and derivatives thereof including 1-alkyl (e.g., 1-methyl, 1-ethyl) derivatives, 1,3-dialkyl (e.g., 1,3-diethyl, 1,3-dibutyl) derivatives, 1,3-diaryl (e.g., 1,3-diphenyl, 1,3-di(p-chlorophenyl), 1,3-di(p-ethoxycarbonylphenyl)) derivatives, and 1-alkyl-3-aryl (e.g., 1-ethyl-3-phenyl) derivatives;

(f) 2-thio-2,4-thiazolidinedione nuclei, such as rhodanine and derivatives thereof including 3-alkylrhodanine (e.g., 3-ethylrhodanine, 3-alkylrhodanine), and 3-arylrhodanine (e.g., 3-phenylrhodanine);

(g) 2-thio-2,4-oxazolidinedione (2-thio-2,4-(3H, 5H)-oxazoledione) nuclei, such as 2-ethyl-2-thio-2,4-oxazolidine-dione;

(h) thianaphthenone nuclei, such as 3(2H)-thianaphthenone, and 3(2H)-thianaphthenone-1,1-dioxide;

(i) 2-thio-2,5-thiazolidinedione nuclei, such as 3-ethyl-2-thio-2,5-thiazolidinedione;

(j) 2,4-thiazolidinedione nuclei, such as 2,4-thiazolidinedione, 3-ethyl-2,4-thiazolidinedione, and 3-phenyl-2,4-thiazolidinedione;

(k) thiazolidione nuclei, such as 4-thiazolidinone, 3-ethyl-4-thiazolidinone;

(l) 4-thiazolidinone nuclei, such as 2-ethylmercapto-5-thiazolin-4-one, and 2-alkylphenylamino-5-thiazolin-4-one;

(m) 2-imino-2-oxozolin-4-one (hydantoine) derivatives;

(n) 2,4-imidazolidinedione (hydantoine) derivatives, such as 2,4-imidazolidinedione, and 3-ethyl-2,4-imidazolidine-dione;

(o) 2-thio-2,4-imidazolidinedione (2-thiohydantoine) derivatives, such as 2-thio-2,4-imidazolidinedione, and 3-ethyl-2-thio-2,4-imidazolidinedione;

(p) 2-imidazolin-5-one nuclei, such as 2-n-propyl-mercapto-2-imidazolin-5-one; and (q) furan-5-one.

Specific examples of the compounds represented by formula (I) in the present invention are shown below.

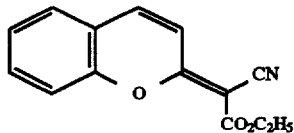

(I-1)

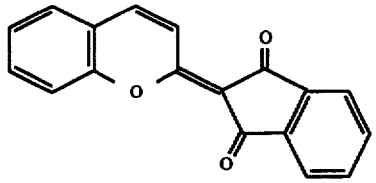

(I-2)

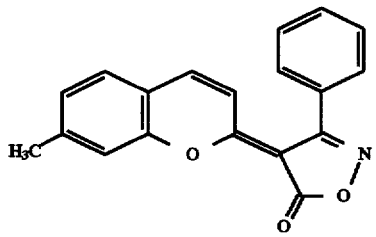

(I-3)

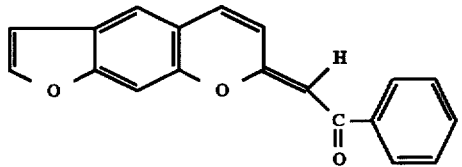

(I-4)

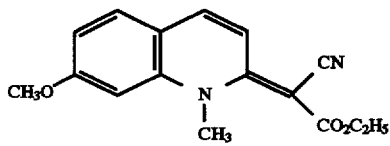

(I-5)

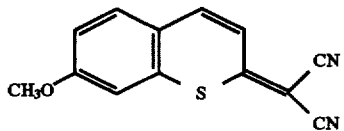

(I-6)

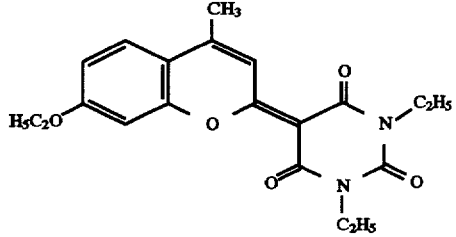

(I-7)

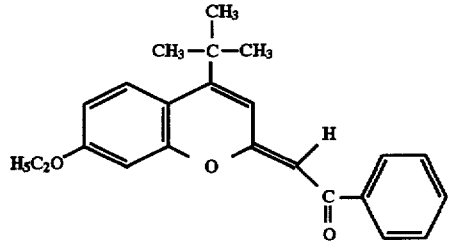

(I-8)

-continued
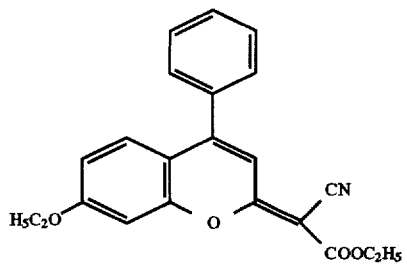
(I-9)
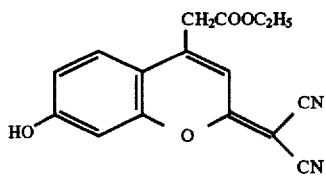
(I-10)
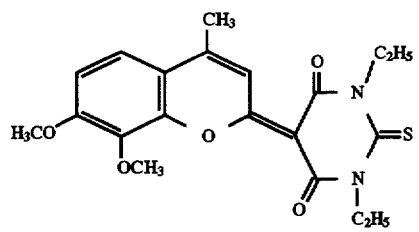
(I-11)
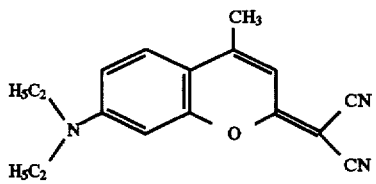
(I-12)
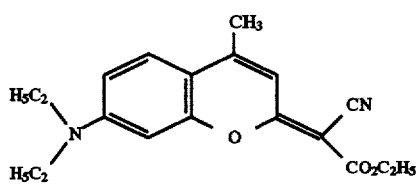
(I-13)
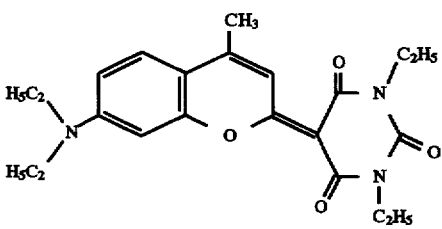
(I-14)
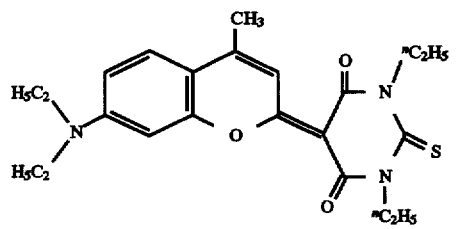
(I-15)
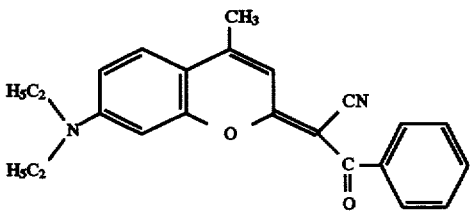
(I-16)
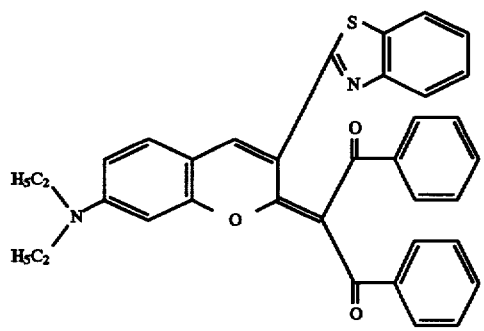
(I-17)
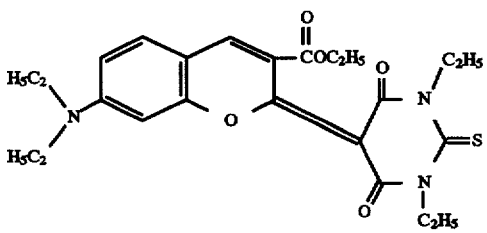
(I-18)
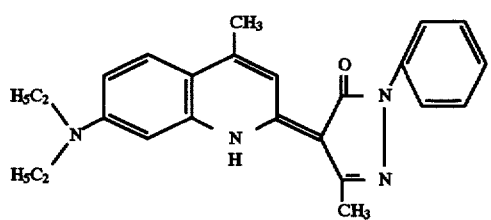
(I-19)
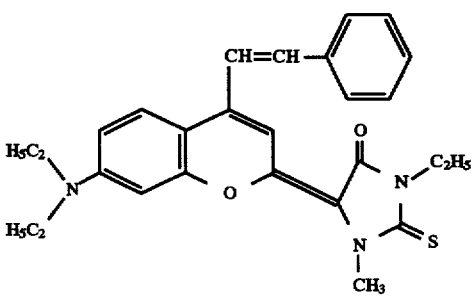
(I-20)

-continued
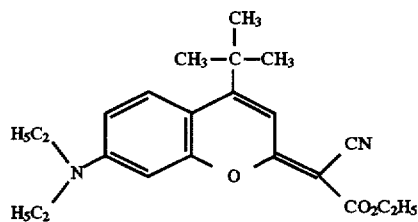
(I-21)
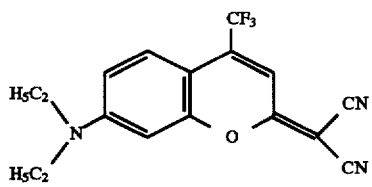
(I-22)
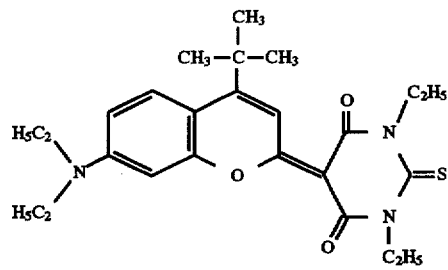
(I-23)
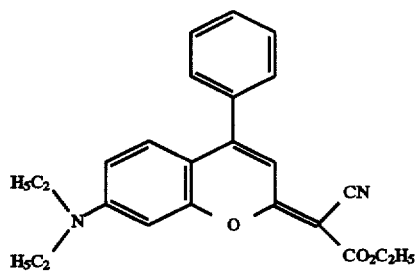
(I-24)
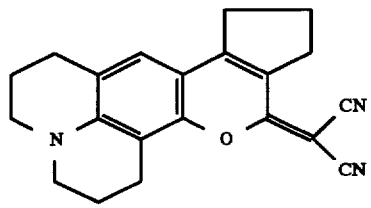
(I-25)
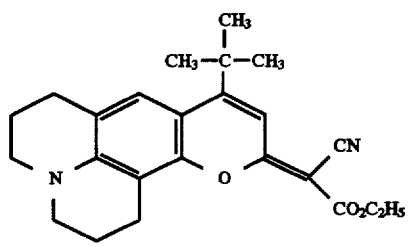
(I-26)
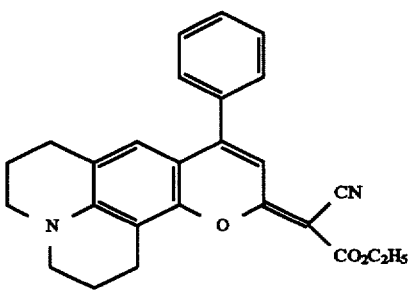
(I-27)
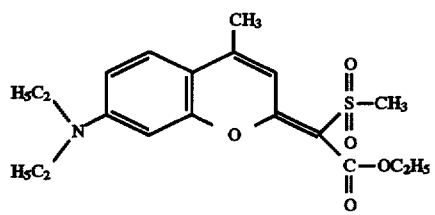
(I-28)
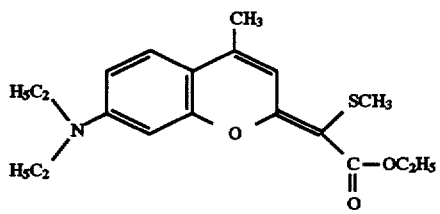
(I-29)
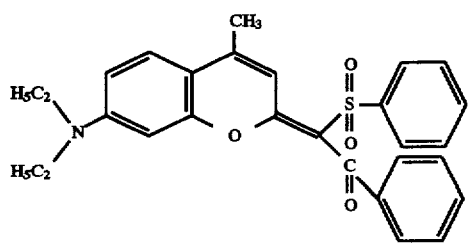
(I-30)
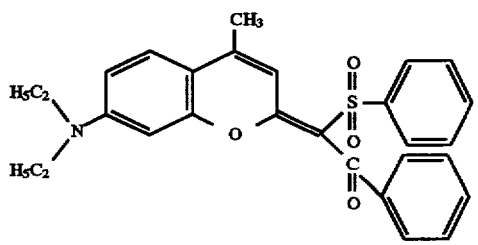
(I-31)

-continued
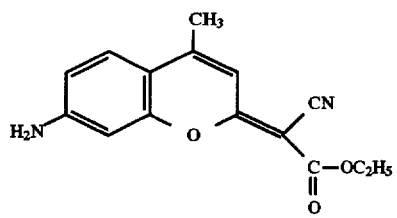 (I-32)
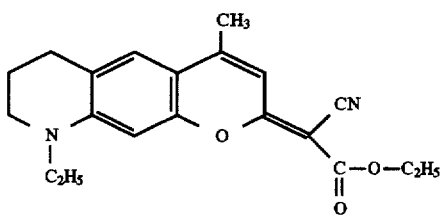 (I-33)
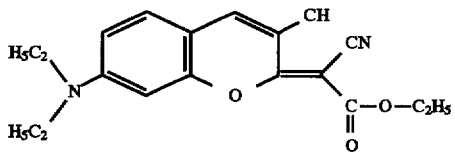 (I-34)
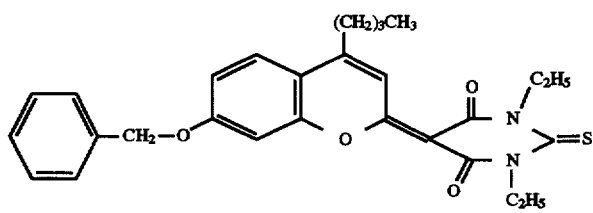 (I-35)
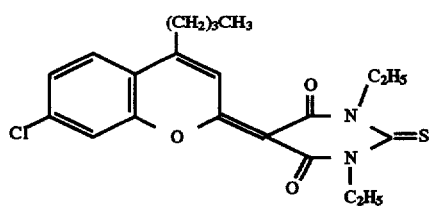 (I-36)
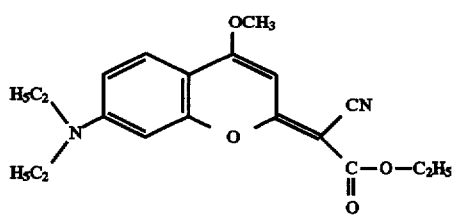 (I-37)
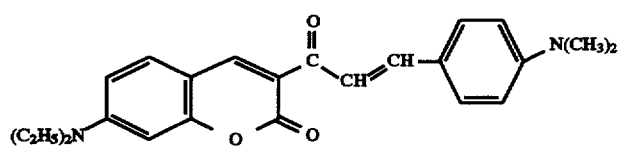 (I-38)
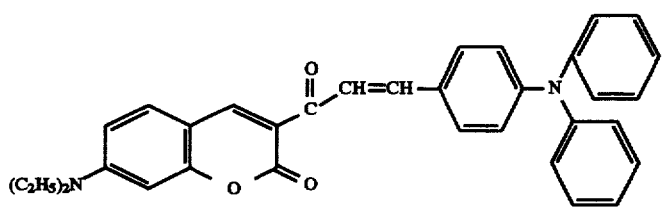 (I-39)
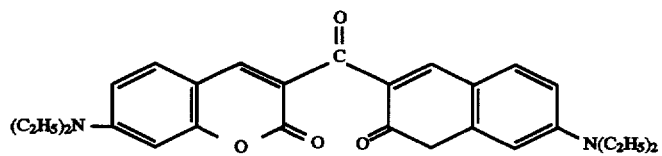 (I-40)
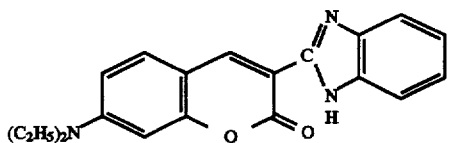 (I-41)
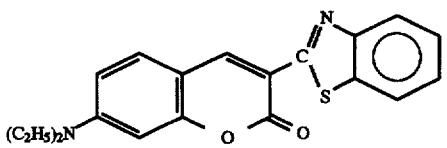 (I-42)

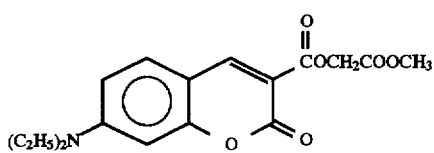
(I-43)

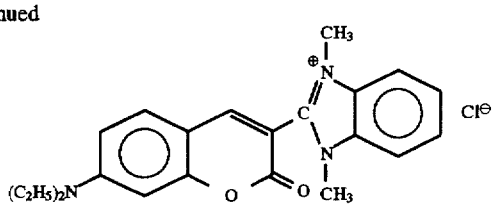
(I-44)

Among these, preferred are (I-12), (I-13), (I-16), (I-17), (I-21), (I-25), (I-36), (I-41), and (I-42).

The sensitizing dyes represented by formula (I) for use in the photopolymerizable composition of the present invention may be used individually or in combination of two or more thereof.

The titanocene compound which is the second component in the photopolymerization initiation system of the present invention is described below. The titanocene compound of the present invention may be appropriately selected from known compounds described, for example, in JP-A-59-152396 and JP-A-61-151197 as long as the compound is a titanocene compound capable of generating active radicals upon light irradiation in the presence of the above-described sensitizing dye together.

More specific examples of the titanocene compound include dicyclopentadienyl-Ti-dichloride, dicyclopentadienyl-Ti-bisphenyl, dicyclopentadienyl-Ti-bis-2,3,4,5,6-penta-fluorophen-1-yl (hereinafter referred to as "A-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl (hereinafter referred to as "A-2"), dimethylcylopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-yl)-phenyl)titanium (hereinafter referred to as "A-3").

The titanocene compounds for use in the photopolymerizable composition of the present invention may be used individually or in combination of two or more thereof.

With respect to the use amount of the above-described sensitizing dye and titanocene compound constituting the photopolymerization initiation system for use in the photopolymerizable composition of the present invention, it is suitable to use the sensitizing dye in an amount of from 0.05 to 30 parts by weight, preferably from 0.1 to 20 parts by weight, and more preferably from 0.2 to 10 parts by weight, and the titanocene compound in an amount of from 0.5 to 100 parts by weight, preferably from 1 to 80 parts by weight, more preferably from 2 to 50 parts by weight, each based on 100 parts by weight of the ethylenic compound.

The photopolymerizable composition of the present invention may contain, in addition to the above-described sensitizing dye and titanocene compound, compounds (1) to (8) which will be described below, for the purpose of increasing the sensitivity.

Compound (1) having a carbon-halogen bond is preferably a compound represented by the following formula (V), (VI), (VII), (VIII), (IX), (X) or (XI):

a compound represented by formula (V):

(V)

wherein X represents a halogen atom; $Y^1$ represents —$CX_3$ (X is a halogen atom), —$NH_2$, —$NHR^{25}$, —$NR^{25}$ or —$OR^{25}$, in which $R^{25}$ and $R^{25'}$ each represents an alkyl group, a substituted alkyl group, an aryl group or a substituted aryl group; and $R^{24}$ represents —$CX_3$ (X is a halogen atom), an alkyl group, a substituted alkyl group, an aryl group, a substituted aryl group, an alkenyl group or a substituted alkenyl group;

a compound represented by formula (VI):

(VI)

wherein $R^{26}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; X represents a halogen atom; and n represents an integer of from 1 to 3;

a compound represented by formula (VII):

$$R^{27}-E-CH_{2-m}X_m-R^{28} \quad (VII)$$

wherein R represents an aryl group or a substituted aryl group; $R^{28}$ represents —CO—$NR^{29}R^{30}$

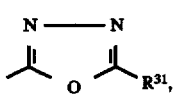, or a halogen atom, in which $R^{29}$ and $R^{30}$ each represents an alkyl group, a substituted alkyl group, an alkenyl group, a substituted alkenyl group, an aryl group or a substituted aryl group, and $R^{31}$ has the same meaning as $R^{24}$ in formula (VI); E represents —CO—, —CS— or —$SO_2$—; and m represents 1 or 2;

a compound represented by formula (VIII):

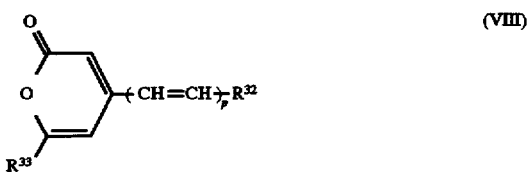
(VIII)

wherein $R^{32}$ represents an aryl or heterocyclic group which may be substituted; $R^{33}$ represents a trihaloalkyl or trihaloalkenyl group having from 1 to 3 carbon atoms; and p represents 1, 2 or 3;

a carbonylmethylene heterocyclic compound having a trihalogenomethyl group represented by formula (IX):

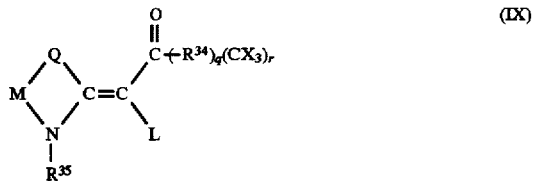

wherein L represents a hydrogen atom or a substituent represented by formula: CO—$(R^{34})_n(CX_3)_m$; M represents a substituted or unsubstituted alkylene group; Q represents a sulfur atom, a selenium atom, an oxygen atom, a dialkyl-methylene group, an alken-1,2-ylene group, a 1,2-phenylene group or an —N—$R^{35}$ group, and M and Q may be combined to form 3 or 4 ring members in a ring; $R^{34}$ represents a carbocyclic or heterocyclic aromatic group; $R^{35}$ represents a substituted or unsubstituted alkyl group, a substituted or unsubstituted aralkyl group or a substituted or unsubstituted alkoxyalkyl group; X represents a chlorine, bromine or iodine atom; and q=0 and r=1, or q=1 and r=1 or 2;

a 4-halogeno-5-(halogenomethylphenyl)oxazole derivative represented by formula (X):

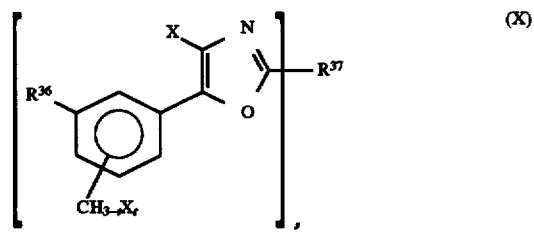

wherein X represents a halogen atom; t represents an integer of from 1 to 3; s represents an integer of from 1 to 4; $R^{36}$ represents a hydrogen atom or a $CH_{3-t}X_t$ group; and $R^{37}$ represents an s-valent unsaturated organic group which may be substituted; and a 2-(halogenomethylphenyl)-4-halogenooxazole derivative represented by formula (XI):

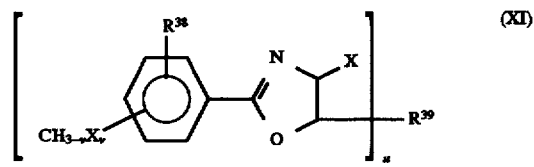

wherein X represents a halogen atom; v represents an integer of from 1 to 3; u represents an integer of from 1 to 4; $R^{38}$ represents a hydrogen atom or a $CH_{3-v}X_v$ group; and $R^{39}$ represents a u-valent unsaturated organic group which may be substituted.

Examples of the above-described compounds having a carbon-halogen bond include:

compounds described in Wakabayashi et al, *Bull. Chem. Soc. Japan*, 42, 2924 (1969) such as 2-phenyl-4,6-bis(tri-chloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine;

compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

compounds described in JP-A-53-133428 such as 2-(4-methoxynaphtho-1-yl)-4,6-bistrichloromethyl-S-triazine, 2-(4-ethoxynaphtho-1-yl)-4,6-bistrichloromethyl-S-triazine, 2-[4-(2-ethoxyethyl)-naphtho-1-yl]-4,6-bistrichloromethyl-S-triazine, 2-(4,7-dimethoxynaphtho-1-yl)-4,6-bistrichloromethyl-S-triazine and 2-(acenaphtho-5-yl)-4,6-bistrichloromethyl-S-triazine;

compounds described in German Patent 3,337,024 as set forth below:

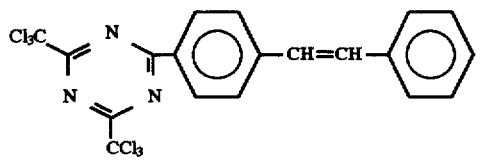

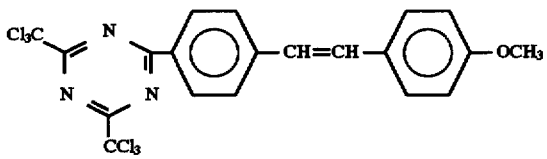

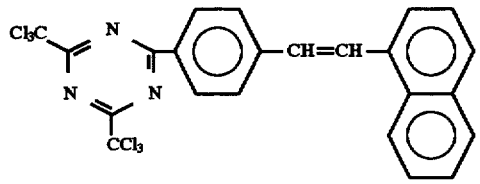

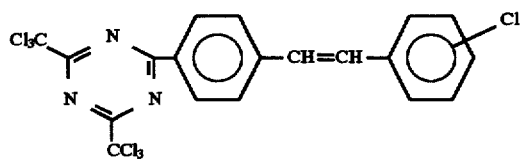

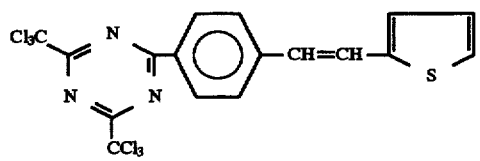

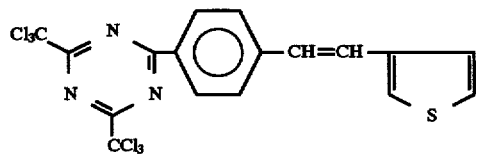

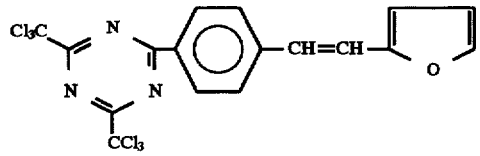

-continued

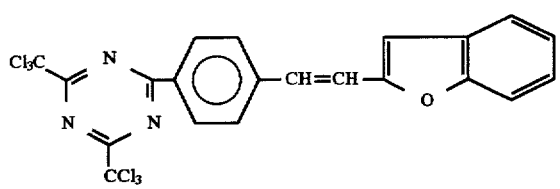

compounds described in F. C. Schaefer et al, *J. Org. Chem.*, 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine;

compounds described in JP-A-62-58241 as set forth below:

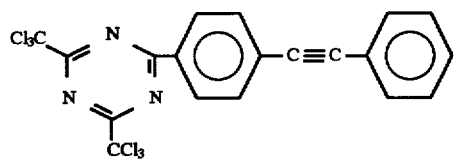

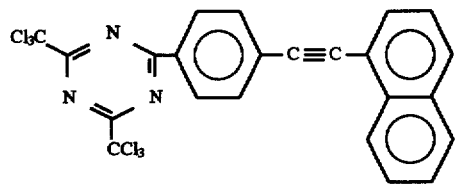

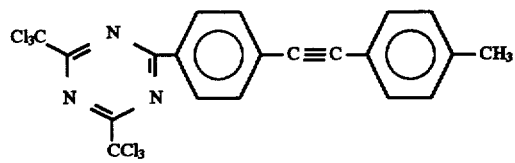

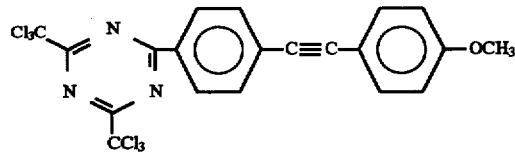

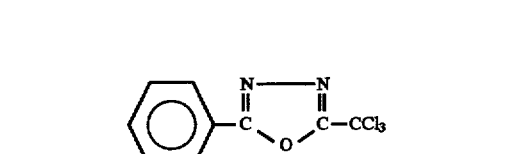

-continued

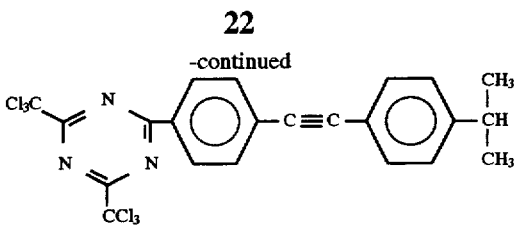

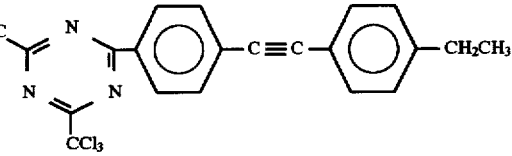

compounds described in JP-A-5-281728 as set forth below:

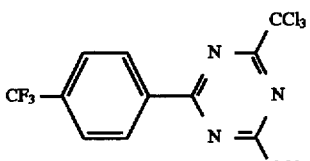

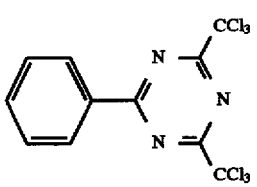

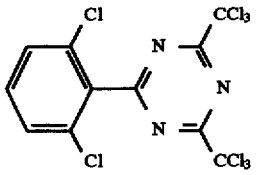

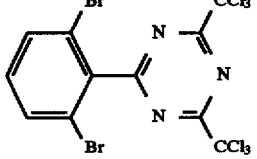

compounds set forth below, which can be easily synthetized by one skilled in the art according to the synthetisis method described in M. P. Hutt, E. F. Elslager and L. M. werbel, *Journal of Heterocyclic Chemistry* vol. 7 (No. 3), page 511 et seq (1970):

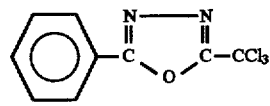 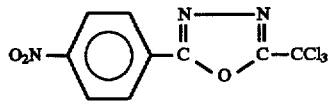

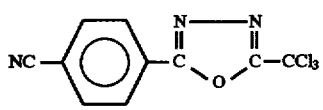 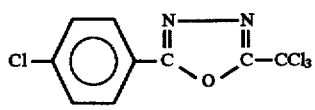

-continued
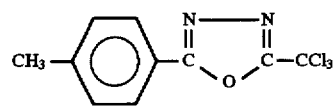
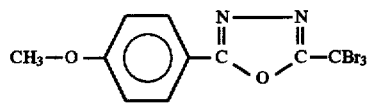
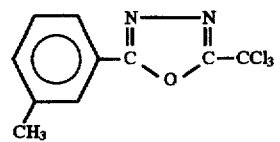
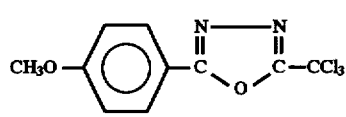
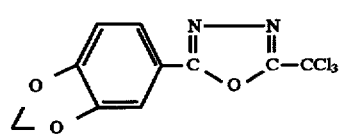
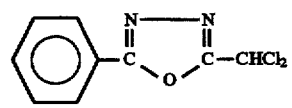
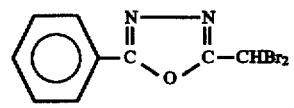
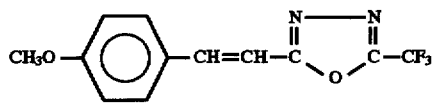
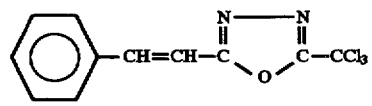
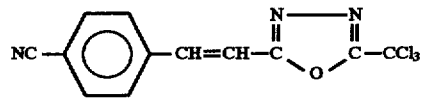
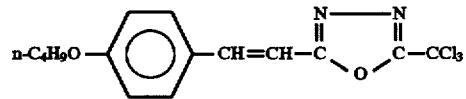
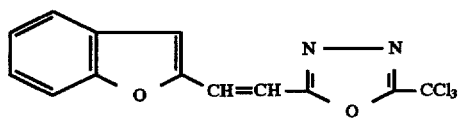
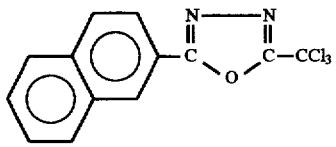
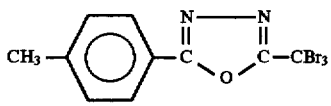
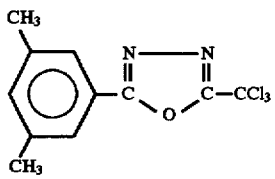
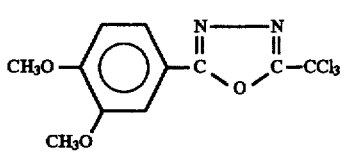
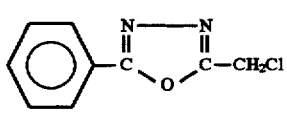
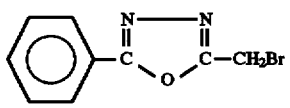
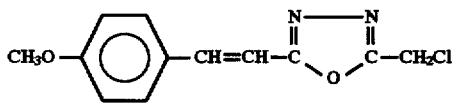
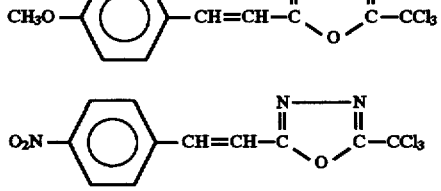
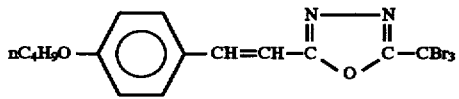
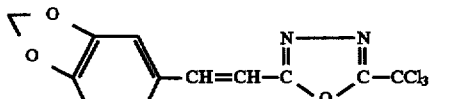
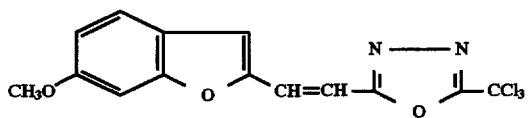

25
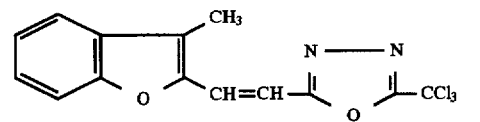
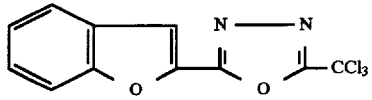
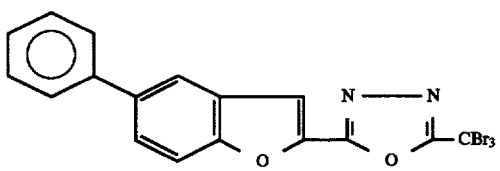
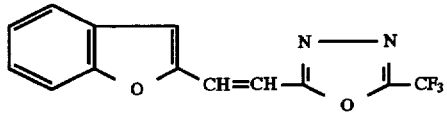
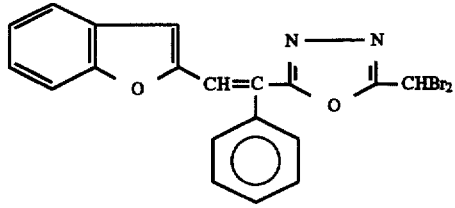
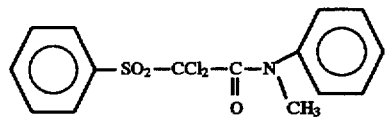
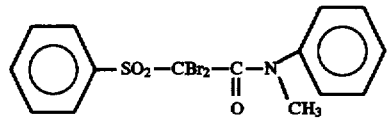
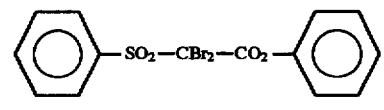
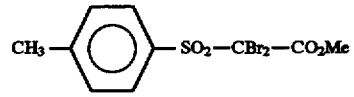
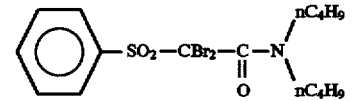
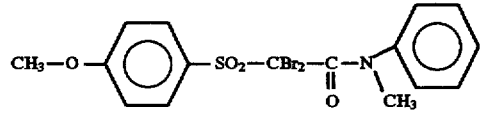
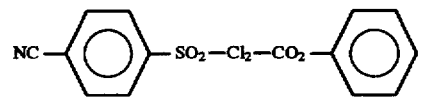
26
-continued
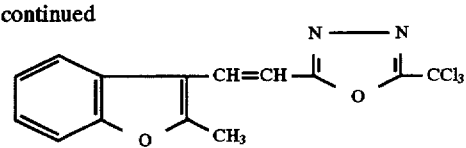
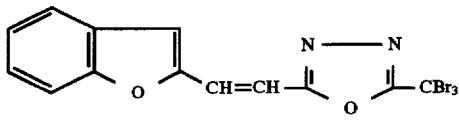
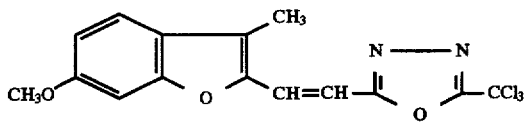
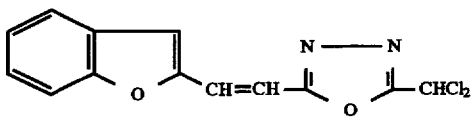
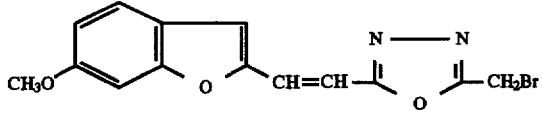
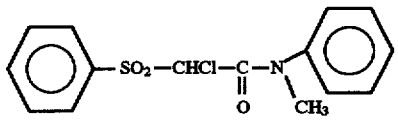
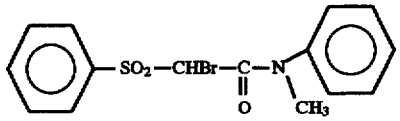
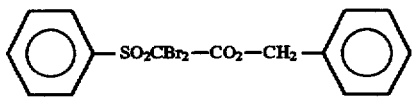
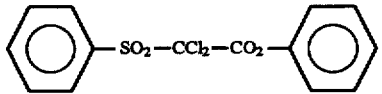
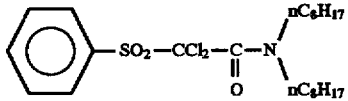
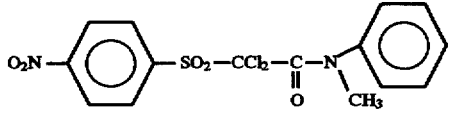
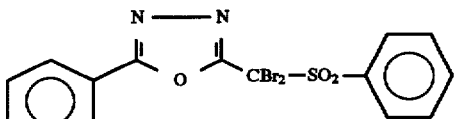

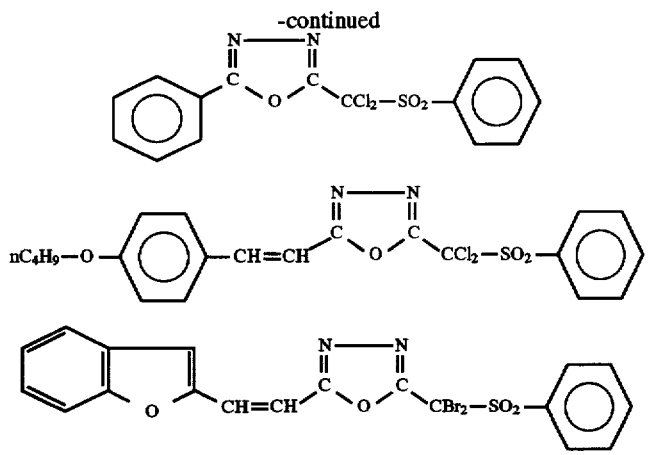

compounds described in German Patent 2,641,100 such as 4-(methoxystyryl)-6-(3,3,3-trichloropropenyl)-2-pyrone and 4-(3,4,5-trimethoxystyryl)-6-trichloromethyl-2-pyrone;

compounds described in German Patent 3,333,450 as set below:

(Q = S, R³⁴ = a benzene ring)

| | $R^{35}$ | M | L | g | $(CX_3)$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ |

(the above compounds are included in the above-described compounds (IX))

compounds described in German Patent 3,021,590 as set forth below:

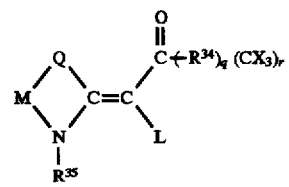

| | $R^{37}$ | X |
|---|---|---|
| 1 | –C₆H₅ (phenyl) | Cl |
| 2 | –C₆H₄–OCH₃ | Cl |
| 3 | –C₆H₄–CN | Cl |

-continued

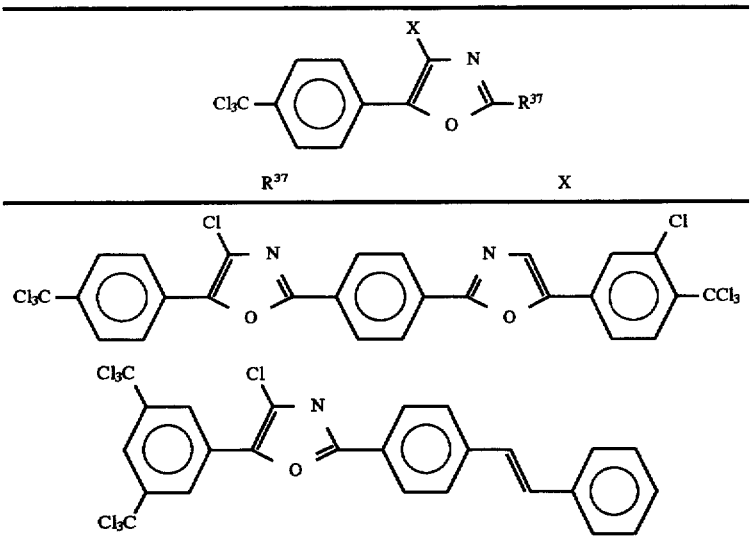

compounds described in German Patent 3,021,599 as set forth below:

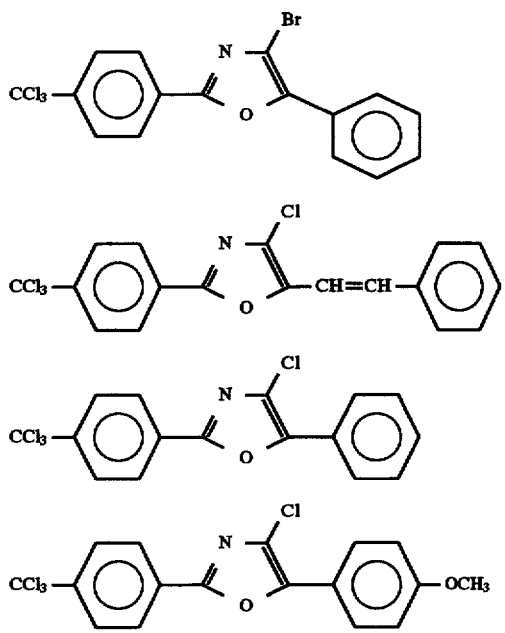

The ketone compound represented by formula (II) as for use in the present invention is described below. Ar represents an aromatic group selected from groups represented by formula (II-a). $R^7$ and $R^8$ each represents a hydrogen atom or an alkyl group having from 1 to 8 carbon atoms, or $R^7$ and $R^8$ may be combined with each other to form a carbon ring (e.g., cyclohexane, benzene ring) along with a carbon atom. $R^9$, $R^{10}$, $R^{11}$, $R^{12}$ and $R^{13}$ each independently represents a hydrogen atom, a halogen atom, an alkyl group having from 1 to 12 carbon atoms, an alkenyl group having from 3 to 12 carbon atoms, an aryl group, an alkoxy group having from 1 to 12 carbon atoms, a hydroxyl group, an —S—$R^{15}$ group, an —SO—$R^{15}$ group or an —SO$_2$—$R^{15}$ group, in which $R^{15}$ represents an alkyl group having from 1 to 12 carbon atoms or an acyl, alkenyl or aryl (e.g., phenyl) group having from 2 to 13 carbon atoms. These alkyl, acyl, alkenyl and aryl groups may be substituted with a substituent(s) having from 1 to 6 carbon atoms. $L_1$ represents a single bond or an alkylene (e.g., ethylene) group which may be substituted with an alkyl group or an amino group. $R^{14}$ represents a hydrogen atom, an alkyl group or an acyl group. Y represents a hydrogen atom or a group represented by formula (II-b), in which $R^7$ and $R^8$ in formula (II-b) are the same as those defined above.

Specific examples of the ketone compound include the following compounds described in U.S. Pat. No. 4,318,791 and European Patent 0284561A:

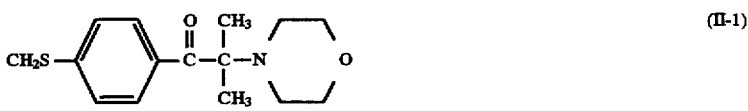

(II-1)

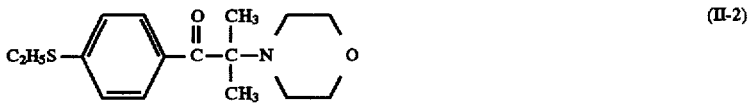

(II-2)

-continued

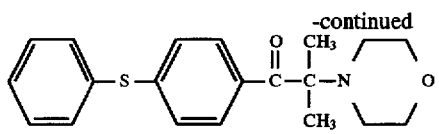 (II-3)

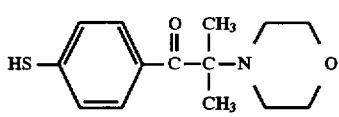 (II-4)

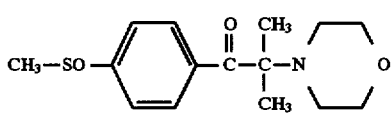 (II-5)

 (II-6)

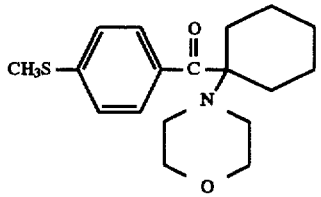 (II-7)

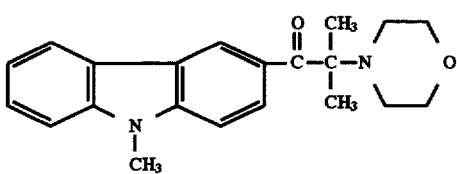 (II-8)

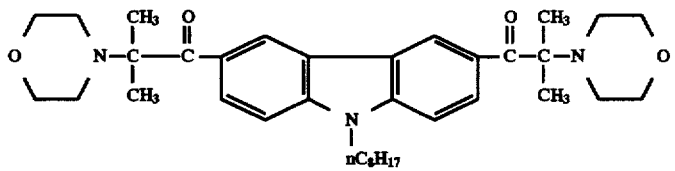 (II-9)

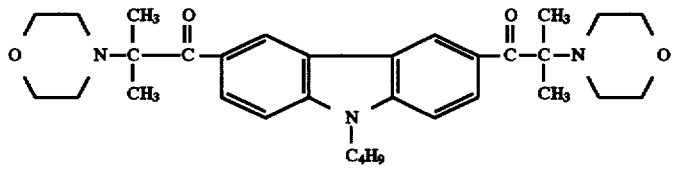 (II-10)

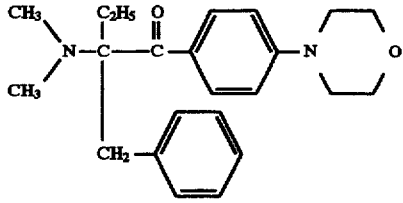

The ketoxime compound represented by formula (III) as component (3) for use in the present invention is described below.

In formula (III), $R^{16}$ and $R^{17}$ are the same or different, and each represents a substituted or unsubstituted hydrocarbon group which may contain an unsaturated bond or a substituted or unsubstituted heterocyclic ring. $R^{18}$ and $R^{19}$ are the same or different, and each represents a hydrogen atom, a substituted or unsubstituted hydrocarbon group which may contain an unsaturated bond, a substituted or unsubstituted heterocyclic group, a hydroxyl group, a substituted oxy group, a mercapto group or a substituted thio group. $R^{20}$ and $R^{21}$ are the same or different, and each represents a hydrogen atom, a substituted or unsubstituted hydrocarbon group which may contain an unsaturated bond, or a substituted carbonyl group, or $R^{20}$ and $R^{21}$ may be combined with each other to form a ring and represent an alkylene group having from 2 to 8 carbon atoms which may contain —O—, —$NR^{20}$—, —$NR^{21}$—, —O—CO—, —NH—CO—, —S— and/or —$SO_2$— in the linking main chain of the ring.

Specific examples of the ketoxime compound include the following compounds but the present invention is by no means limited thereto.

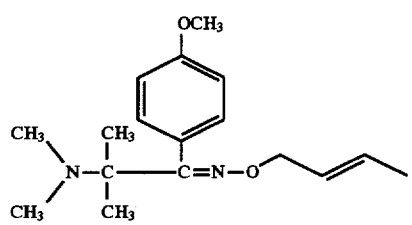 (III-1)
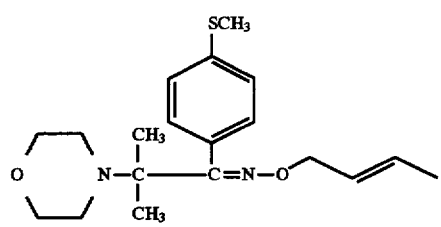 (III-2)
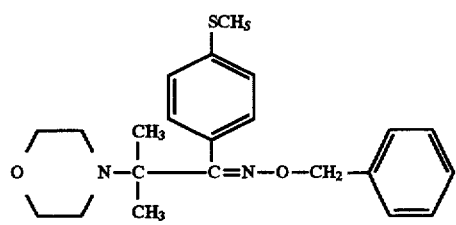 (III-3)
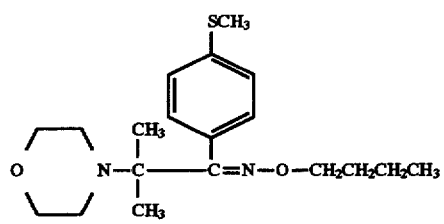 (III-4)
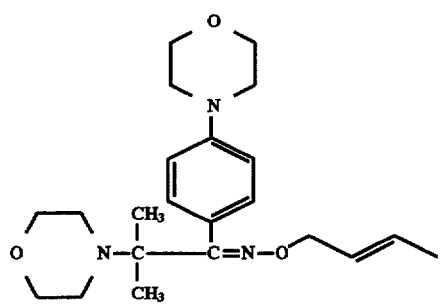 (III-5)
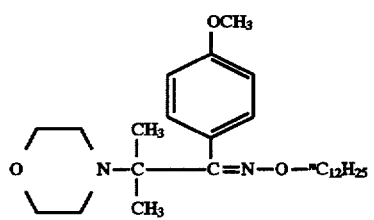 (III-6)
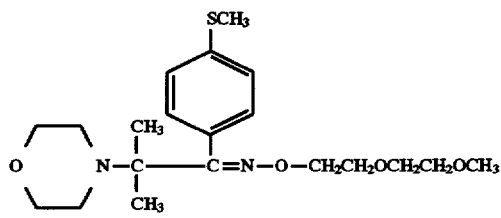 (III-7)

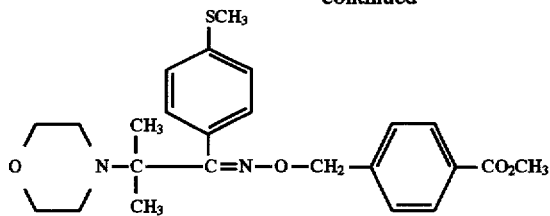 (III-8)

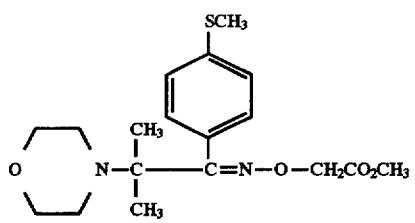 (III-9)

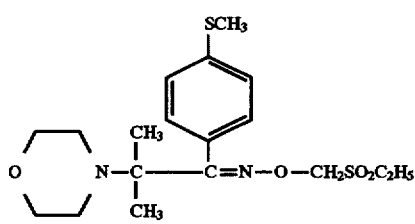 (III-10)

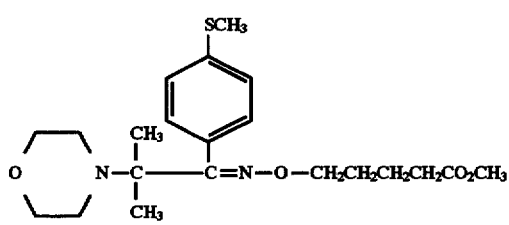 (III-11)

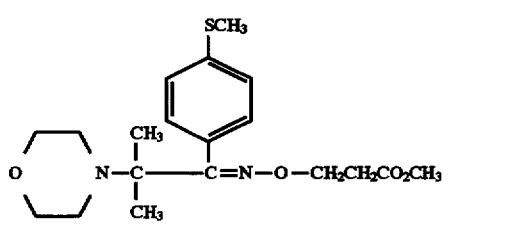 (III-12)

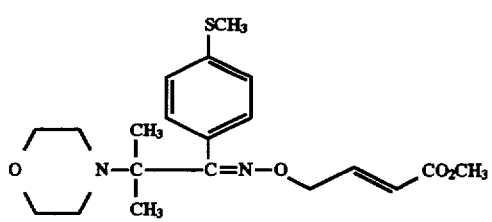 (III-13)

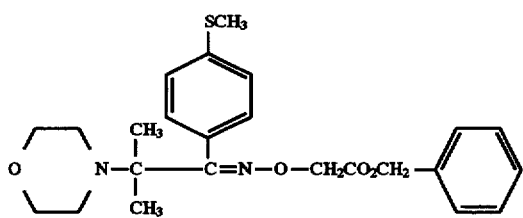 (III-14)

The organic peroxide as component (4) for use in the present invention includes compounds having an oxygen-oxygen bond in the molecule. Examples thereof include methyl ethyl ketone peroxide, cyclohexanone peroxide, 3,3,5-trimethylcyclohexanone peroxide, methylcyclohexanone peroxide, acetylacetone peroxide, 1,-bis(tert-butylperoxy)-3,3,5-trimethylcyclohexane, 1,1-bis(tert-butylperoxy) cyclohexane, 2,2-bis(tert-butylperoxy)butane, tert-butyl hydroperoxide, cumene hydroperoxide, diisopropylbenzene hydroperoxide, paramethane hydroperoxide, 2,5- dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)-benzene, 2,5-dimethyl-2,5-di(tert-butylperoxy)hexane, 2,5-dimethyl-2,5-di(tert-butylperoxy) hexine-3, acetyl peroxide, isobutyryl peroxide, octanoyl peroxide, decanoyl peroxide, lauloyl peroxide, 3,5,5-trimethylhexanoyl peroxide, succinic peroxide, benzoyl peroxide, 2,4-dichlorobenzoyl peroxide, metatoluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-butyl peroxybenzoate, di-tert-butyl peroxyisophthalate, 2,5-dimethyl- 2,5-di(benzoylperoxy)hexane, tert-butyl peroxymaleic acid, tert-butyl peroxyisopropylcarbonate, 3,3',4,4'-tetra(t-butylperoxycarbonyl)benzophenone, 3,3',4,4'-tetra(t-amylperoxycarbonyl)benzophenone, 3,3',4,4-tetra-(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone, carbonyldi (t-butylperoxy dihydrogen diphthalate) and carbonyldi (t-hexylperoxy dihydrogen diphthalate).

Among these, preferred are peroxide esters such as 3,3', 4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-t-butyl diperoxyisophthalate.

The thio compound as component (5) represented by formula (IV) for use in the present invention is described below.

The alkyl group represented by $R^{22}$ or $R^{23}$ in formula (IV) is preferably an alkyl group having from 1 to 4 carbon atoms. The aryl group represented by $R^{22}$ is preferably an aryl group having from 6 to 10 carbon atoms such as phenyl and naphthyl, and the substituted aryl group includes the above-described aryl group substituted with a halogen atom such as chlorine, an alkyl group such as methyl or an alkoxy group such as methoxy or ethoxy.

Specific examples of the thio compound represented by formula (IV) include the compounds shown in the table below.

| No. | $R^{22}$ | $R^{23}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4-CH_3$ | $C_4H_9$ |
| 10 | $C_6H_4-OCH_3$ | $CH_3$ |
| 11 | $C_6H_4-OCH_3$ | $C_2H_5$ |
| 12 | $C_6H_4-OC_2H_5$ | $CH_3$ |
| 13 | $C_6H_4-OC_2H_5$ | $C_2H_5$ |
| 14 | $C_6H_4-OCH_3$ | $C_4H_9$ |
| 15 | $-(CH_2)_5-$ | |
| 16 | $-(CH_2)_2-S-$ | |
| 17 | $-CH(CH_3)-CH_2-S-$ | |
| 18 | $-CH_2-CH(CH_3)-S-$ | |
| 19 | $-C(CH_3)_2-CH_2-S-$ | |
| 20 | $-CH_2-C(CH_3)_2-S-$ | |
| 21 | $-(CH_2)_2O-$ | |
| 22 | $-CH(CH_3)-CH_2-O-$ | |
| 23 | $-C(CH_3)_2-CH_2-O-$ | |
| 24 | $-CH=CH-N(CH_3)-$ | |
| 25 | $-(CH_2)_3S-$ | |
| 26 | $-(CH_2)_2CH(CH_3)-S-$ | |
| 27 | $-(CH_2)_3O-$ | |
| 28 | $-(CH_2)_5-$ | |
| 29 | $-C_6H_4-O-$ | |
| 30 | $-N=C(SCH_3)-S-$ | |
| 31 | $-C_6H_4-NH-$ | |
| 32 | 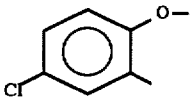 | |
| 33 | 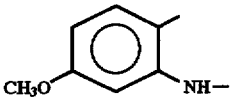 | |
| 34 | 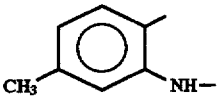 | |
| 35 | 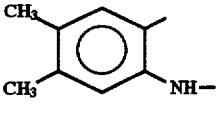 | |
| 36 |  | |
| 37 | 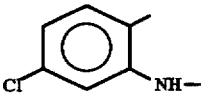 | |
| 38 | 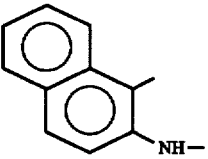 | |
| 39 |  | |
| 40 | 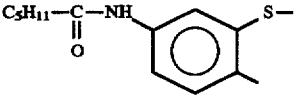 | |
| 41 | 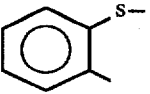 | |

| No. | R²² | R²³ |
|---|---|---|
| 42 | | Cl-phenyl(CH₃)-S— |
| 43 | | CH₃-phenyl(CH₃)-S— |

Examples of the hexaarylbiimidazole as component (6) for use in the present invention include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4', 5,5'-tetraphenylbiimidazole.

The aromatic onium salt as component (7) for use in the present invention includes an aromatic onium salt of elements belonging to Groups 15 (5B), 16 (6B) and 17 (7B) of the Periodic Table, specifically, an onium salt of N, P, As, Sb, Bi, O, S, Se, Te and I. Examples of the aromatic onium salt include the compounds described in JP-B-52-14277, JP-B-52-14278 and JP-B-52-14279. Specific examples thereof are set forth below.

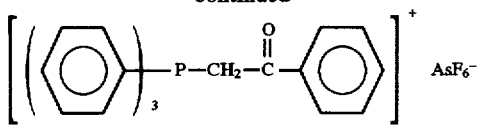

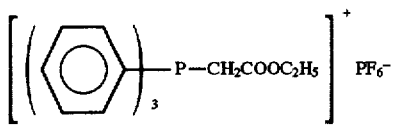

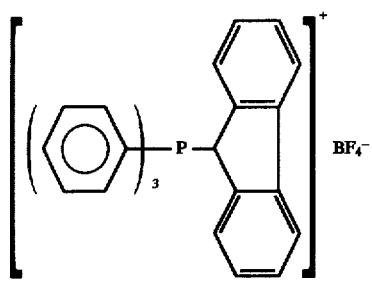

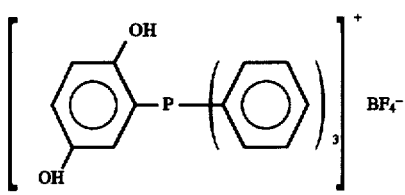

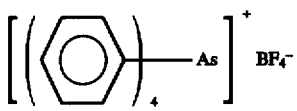

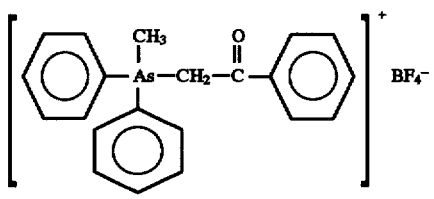

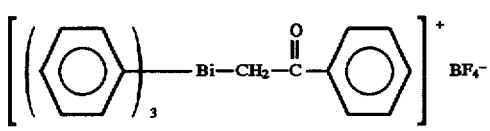

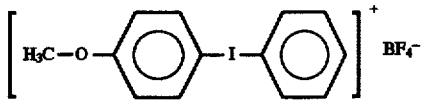

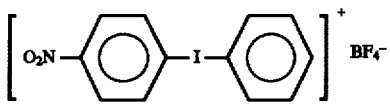

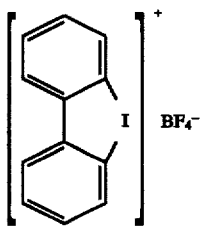

-continued

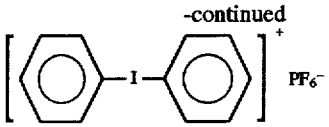

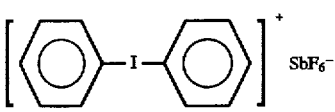

Among these, preferred are compounds of $BF_4$ salt and $PF_6$ salt, more preferred are $BF_4$ and $PF_6$ salts of aromatic iodonium.

Examples of the ketoxime ester as component (8) for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

These additives (1) to (8) may be used individually or in combination of two or more thereof. The use amount is suitably from 0.05 to 100 parts by weight, preferably from 1 to 80 parts by weight, and more preferably from 3 to 50 parts by weight, based on 100 parts by weight of the ethylenic compound.

The composition of the present invention contains the above-described photopolymerization initiation system usually in a very low concentration. If the system is contained in an excessively high concentration, disadvantageous results come out such as cutting of effective light rays. The photopolymerization initiation system of the present invention is preferably used in an amount of from 0.01 to 60% by weight, more preferably from 1 to 30% by weight, based on the total amount of the photopolymerizable ethylenic unsaturated compound and a linear organic high molecular polymer which is added if desired.

The photopolymerizable composition of the present invention preferably contains a linear organic high molecular polymer as a binder. The "linear organic high molecular polymer" may be any compound as long as it is a linear organic high molecular polymer having compatibility with the photopolymerizable ethylenic unsaturated compound. Preferably, a water- or alkalescent water-soluble or swellable linear organic high molecular polymer capable of water development or alkalescent water development is selected. The linear organic high molecular polymer is used not only as a film forming agent of the composition but also as a water, alkalescent water or organic solvent developer which is appropriately selected depending on the use. For example, when a water-soluble organic high molecular polymer is used, water development can be carried out. This kind of linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer described in JP-A-59-44615, JP-B-54-34327, JP-B-58-12577, JP-B-54-25957, JP-A-54-92723, JP-A-59-53836 and JP-A-59-71048. Furthermore, an acidic cellulose derivative having a carboxylic acid group similarly on the side chain is included. An addition product of a cyclic acid anhydride to the addition polymer having a hydroxyl group is also useful. Among these, a [benzyl (meth)acrylate/(meth)acrylic acid/ other addition polymerizable vinyl monomer, if desired]

copolymer and an [allyl (meth)acrylate/(meth)acrylic acid/other addition polymerizable vinyl monomer, if desired] copolymer are preferred. In addition, polyvinyl pyrrolidone and polyethylene oxide are useful as the water-soluble linear organic polymer. Furthermore, an alcohol-soluble polyamide and a polyether of 2,2-bis(4-hydroxyphenyl)propane with epichlorohydrin are also useful so as to increase the strength of the cured film. The above-described linear organic high molecular polymer can be mixed into the entire composition in any optional amount. However, if the mixing amount exceeds 90% by weight, disadvantageous results may be caused in view of the strength of an image formed and the like. The mixing amount is preferably from 30 to 85% by weight. The weight ratio of the photopolymerizable ethylenic unsaturated compound to the linear organic high molecular polymer is preferably from 1/9 to 7/3, more preferably from 3/7 to 5/5.

In the present invention, in addition to the above-described fundamental components, a slight amount of a thermal polymerization inhibitor is preferably added so as to prevent unnecessary thermal polymerization of the polymerizable ethylenic unsaturated compound during the production or storage of the photosensitive composition. Suitable examples of the thermal polymerization inhibitor include hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol) and N-nitrosophenylhydroxyamine primary cerium salt. The addition amount of the thermal polymerization inhibitor is preferably from about 0.01 to about 5% by weight based on the weight of the entire composition. Also, if desired, a higher fatty acid derivative such as a behenic acid and a behenic acid amide may be added to disperse unevenly on the surface of the photosensitive layer during the drying process after coating so as to prevent polymerization inhibition due to oxygen. The addition amount of the higher fatty acid derivative is preferably from about 0.5 to about 10% by weight of the entire composition.

Furthermore, a dye or a pigment may be added for the purpose of coloring the photosensitive layer. Examples of the coloring agent include a pigment such as a phthalocyanine pigment, an azo pigment, carbon black and titanium oxide, Ethyl Violet, Crystal Violet, an azo dye, an anthraquinone dye and a cyanine dye.

The addition amount of the dye or the pigment is preferably from about 0.5 to about 5% by weight of the entire composition. Also, an inorganic filler or other known additives such as a plasticizer may be added so as to improve physical properties of the cured film.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerine and when a binder is used, the plasticizer may be added in an amount of 10% by weight or less based on the total weight of the ethylenic compound and the binder.

The photopolymerizable composition of the present invention is dissolved in various organic solvents and then coated on a support. Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is preferably from 2 to 50% by weight.

The coating amount thereof in terms of the weight after drying is preferably from about 0.1 to about 10 $g/m^2$, more preferably from 0.5 to 5 $g/m^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film as described in JP-B-48-18327 is preferred.

A support having a metal, particularly an aluminum surface is preferably subjected to surface treatment such as graining treatment, dipping treatment in an aqueous solution of sodium silicate, potassium fluorozirconate or phosphate, or anodic oxidation treatment.

An aluminum plate subjected to graining and then to dipping treatment in an aqueous solution of sodium silicate may be preferably used. Furthermore, an aluminum plate subjected to anodic oxidation treatment and then to dipping treatment in an aqueous solution of alkali metal silicate as described in JP-B-47-5125 may be suitably used. The above-described anodic oxidation treatment is carried out by applying current to the aluminum plate as an anode in an electrolyte, for example, in an aqueous or non-aqueous solution of an inorganic acid such as phosphoric acid, chromic acid, sulfuric acid or boric acid or of an organic acid such as oxalic acid or sulfamic acid, which solutions may be used individually or in combination of two or more thereof.

The silicate electrodeposition as described in U.S. Pat. No. 3,658,662 is also effective.

Furthermore, a surface treatment comprising a combination of the above-described anodic oxidation treatment and sodium silicate treatment with a support subjected to electrolysis graining as disclosed in JP-B-46-27481, JP-A-52-58602 and JP-A-52-30503 is also effective.

Moreover, a support subjected in sequence to mechanical graining, chemical etching, electrolysis graining, anodic oxidation treatment and sodium silicate treatment as disclosed in JP-A-56-28893 is also preferred.

Still furthermore, a support may be suitably subjected, after the above-described treatments, to undercoating with a water-soluble resin such as a polymer or copolymer having a polyvinyl phosphonic acid or a sulfonic acid on the side chain, a polyacrylic acid, a water-soluble metal salt (e.g., zinc borate), or a yellow dye or an amine salt.

In addition, a sol-gel treated substrate having conjugation-bonded thereto a functional group capable of addition reaction by radicals as described in JP-A-7-159983 may be used suitably.

The above-described treatments to achieve hydrophilicity are effected not only to render the support surface hydrophilic but also to prevent harmful reaction of the photopolymerizable composition to be coated on the support and at the same time, to improve the adhesion property of the photosensitive layer.

In order to prevent polymerization inhibition action of the oxygen in air, a protective layer comprising a polymer having an excellent oxygen cutting property, such as polyvinyl alcohol, in particular, polyvinyl alcohol having a saponification degree of 99% or more, or an acidic cellulose, may be provided on the photopolymerizable composition layer on the support. The coating method of the protective layer is described in detail, for example, in U.S. Pat. No. 3,458,311 and JP-A-55-49729.

The photopolymerizable composition of the present invention can be used for usual photopolymerization. Furthermore, the composition can be used in various fields, for example, as a photoresist in producing a printing plate or a printed board. In particular, since the photopolymerizable composition of the present invention has such properties as high sensitivity and wide spectral sensitivity extending even to a visible light region, it can provide good effects when it is applied to a photosensitive material for a visible light laser such as an $Ar^+$ laser or a YAG-SHG laser.

The photosensitive material using the photopolymerizable composition of the present invention is subjected to imagewise exposure and then the unexposed area of the photosensitive layer is removed by a developer to obtain an image. When the above-described photopolymerizable composition is used in producing a lithographic printing plate, the developer as described in JP-B-57-7427 is preferably used and preferred are an aqueous solution of an inorganic alkali agent such as sodium silicate, potassium silicate, sodium hydroxide, potassium hydroxide, lithium hydroxide, sodium phosphate, sodium hydrogenphosphate, ammonium phosphate, ammonium hydrogen-phosphate, sodium metasilicate, sodium bicarbonate or aqueous ammonia and an aqueous solution of an organic alkali agent such as monoethanolamine or diethanolamine. The alkali agent is added so that the alkali solution has a concentration of from 0.1 to 10% by weight, preferably from 0.5 to 5% by weight.

The above-described alkaline aqueous solution may contain, if desired, a surfactant or an organic solvent such as benzyl alcohol, 2-phenoxyethanol or 2-butoxyethanol, in a small amount. Examples thereof include those described in U.S. Pat. Nos. 3,375,171 and 3,615,480.

Furthermore, the developers described in JP-A-50-26601, JP-A-58-54341, JP-B-56-39464 and JP-B-56-42860 are also excellent.

The photopolymerizable composition of the present invention exhibits high sensitivity to active light rays over a wide region of from ultraviolet light to visible light. Accordingly, the light source which can be used includes an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as visible and ultraviolet laser lamps, a fluorescent lamp, a tungsten lamp and sunlight.

The present invention will be described below in greater detail by referring to the examples, but the present invention should not be construed as being limited to these examples. All percents, parts, and ratios are by weight unless otherwise indicated.

EXAMPLES 1 TO 13 AND COMPARATIVE EXAMPLES 1 TO 7

A 0.30 mm-thick aluminum plate was subjected to graining of the surface thereof using a nylon blush and a water suspension of 400-mesh pumice stones and then well washed with water. After dipping it in a 10% sodium hydroxide at 70° C. for 60 seconds to effect etching, the plate was washed with flowing water, neutralization-washed with a 20% nitric acid and then washed with water. The resulting plate was subjected to electrolysis graining treatment using a sinewaveform alternating current under conditions of $V_A$=12.7 V in a 1% aqueous nitric acid solution at an anode electricity quantity of 160 coulomb/$dm^2$. The surface roughness measured was 0.6 μ (Ra indication). Subsequently, the plate was dipped in a 30% aqueous sulfuric acid solution to effect desmutting at 55° C. for 2 minutes and then subjected to anodic oxidation treatment in a 20% aqueous sulfuric acid solution at a current density of 2 A/$dm^2$ for 2 minutes to give an anodically oxidized film having a thickness of 2.7 g/$m^2$.

A photosensitive composition having the following composition was coated on the thus-treated aluminum plate to give a dry coating weight of 1.4 g/$m^2$ and then dried at 80° C. for 2 minutes to form a photosensitive layer.

| | |
|---|---|
| Pentaerythritol tetraacrylate | 1.5 g |
| Allyl methacrylate/methacrylic acid copolymer (copolymerization molar ratio: 80/20) | 2.0 g |
| Photopolymerization initiation system | (see Table 1) |
| Fluorine nonionic surfactant | 0.03 g |
| Methyl ethyl ketone | 20 g |
| Propylene glycol monomethyl ether acetate | 20 g |

On the thus-provided photosensitive layer, a 3 wt % aqueous solution of polyvinyl alcohol (saponification degree: 86.5–89 mol %, polymerization degree: 1,000) was coated to give a dry coating weight of 2 g/$m^2$ and dried at 100° C. for 2 minutes.

The photosensitivity test was conducted to visible light. The visible light used was a monochromatic light from a xenon lamp as a light source through Kenko Optical Filter BP-49.

The photosensitivity was determined using FUJI PS Step Guide (a step tablet having 15 stages, manufactured by Fuji Photo Film Co., Ltd., in which the transmission optical density is 0.05 at the initial stage and increased in sequence by 0.15). The sensitivity was shown by the clear stage number of the PS step guide at the time when exposure was made at the illuminance on the photosensitive layer surface of 0.0132 mW/$cm^2$ for 240 seconds. In addition, the sensitivity was measured in the same manner after the samples in Examples 1 to 13 were stored in an oven at 50° C. for 3 days.

Thereafter, the plate was heated at 100° C. for 1 minute and dipped in the following developer at 25° C. for 1 minute to effect development.

| | |
|---|---|
| 1K Potassium silicate | 30 g |
| Potassium hydroxide | 15 g |
| $C_{12}H_{25}$—⟨phenyl⟩—O—⟨phenyl⟩—$SO_3Na$ | 3 g |
| Water | 1,000 g |

The sensitivity was measured using the following compounds as a photopolymerization initiation system by varying the combination in the system and the results obtained are shown in Table 1. The numerals in parentheses are in a unit of

TABLE 1

| Example No. | Sensitizing Dye | Titanocene Compound | Gray Scale Stage Number Immediately After Produced (Clear) | Gray Scale Stage Number After Storage at 50° C., 3 Days (Clear) |
|---|---|---|---|---|
| Example 1 | I-12 (0.05) | A-1 (0.1) | 5.5 | 5.5 |
| 2 | I-13 (0.05) | A-1 (0.1) | 5 | 5 |
| 3 | I-16 (0.05) | A-1 (0.1) | 5 | 4.5 |
| 4 | I-25 (0.05) | A-1 (0.1) | 5 | 5 |
| 5 | I-36 (0.05) | A-1 (0.1) | 5 | 4.5 |
| 6 | I-41 (0.05) | A-1 (0.1) | 5 | 5 |
| 7 | I-42 (0.05) | A-1 (0.1) | 5 | 5 |
| 8 | I-12 (0.05) | A-2 (0.1) | 5.5 | 5 |
| 9 | I-13 (0.05) | A-2 (0.1) | 5 | 5 |
| 10 | I-16 (0.05) | A-2 (0.1) | 5.5 | 5.5 |
| 11 | I-12 (0.05) | A-3 (0.1) | 5 | 5 |
| 12 | I-13 (0.05) | A-3 (0.1) | 5 | 5 |
| 13 | I-16 (0.05) | A-3 (0.1) | 6 | 6.5 |
| Comp. Ex. 1 | I-12 (0.1) | — | 0 | |
| 2 | I-13 (0.1) | — | 0 | |
| 3 | I-16 (0.1) | — | 0 | |
| 4 | — | A-1 (0.1) | 0 | |
| 5 | — | A-2 (0.1) | 0 | |
| 6 | — | A-3 (0.1) | 0 | |
| 7 | Comparative Dye a (0.1) | A-1 (0.1) | 0 | | comparative Dye a

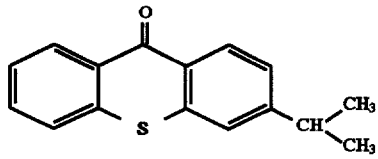

EXAMPLES 14 TO 36 AND COMPARATIVE EXAMPLE 8

Samples were prepared thoroughly in the same manner as in Example 1 except for changing the photopolymerization initiation system in Example 1 to the compounds described in Table 2 below and each sample was tested on the sensitivity in the same manner as in Example 1. The results obtained are shown in Table 2 below. In addition, the sensitivity was measured in the same manner after the samples in Examples 14 to 36 were stored in an oven at 50° C. for 3 days.

TABLE 2

| Example No. | Sensitizing Dye | Titanocene Compound | Compounds (1) to (8) | Gray Scale Stage Number Immediately After Produced (Clear) | Gray Scale Stage Number After Storage at 50° C., 3 Days (Clear) |
|---|---|---|---|---|---|
| 14 | I-12 (0.05) | A-1 (0.1) | 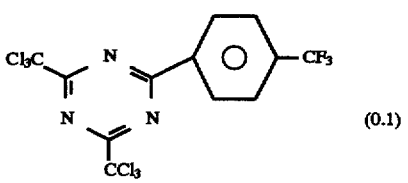 (0.1) | 7 | 7 |
| 15 | I-12 (0.1) | A-1 (0.15) | 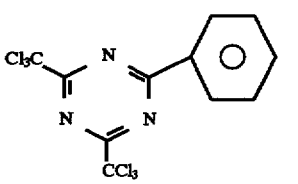 (0.1) | 7 | 7 |
| 16 | I-12 (0.08) | A-1 (0.2) | 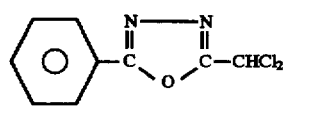 (0.2) | 7 | 7 |
| 17 | I-12 (0.05) | A-1 (0.1) | II-1 (0.2) | 7.5 | 7.5 |
| 18 | I-12 (0.05) | A-1 (0.1) | II-7 (0.2) | 7.5 | 7.5 |

TABLE 2-continued

| | Sensitizing Dye | Titanocene Compound | Compounds (1) to (8) | Gray Scale Stage Number Immediately After Produced (Clear) | Gray Scale Stage Number After Storage at 50° C., 3 Days (Clear) |
|---|---|---|---|---|---|
| 19 | I-12 (0.1) | A-1 (0.2) | III-6 (0.2) | 7.5 | 7.5 |
| 20 | I-12 (0.1) | A-1 (0.2) | III-9 (0.2) | 7 | 7 |
| 21 | I-12 (0.05) | A-1 (0.1) | tetra(tC₄H₉OOC)-substituted benzophenone dicarboxylate (0.3) | 7 | 6.5 |
| 22 | I-12 (0.05) | A-1 (0.1) | 2-mercaptobenzothiazole (0.4) | 7.5 | 7 |
| 23 | I-12 (0.05) | A-1 (0.15) | 5-methoxy-2-mercaptobenzimidazole (0.2) | 7.5 | 7 |
| 24 | I-12 (0.05) | A-1 (0.1) | diphenyliodonium PF₆⁻ (0.2) | 7 | 6.5 |
| 25 | I-12 (0.05) | A-1 (0.2) | [2-(2-chlorophenyl)-4,5-diphenylimidazole] dimer (0.5) | 7.5 | 7.5 |
| 26 | I-12 (0.05) | A-1 (0.1) | 2,3-butanedione-2-(O-benzoyloxime) (0.2) | 7 | 7 |
| 27 | I-13 (0.1) | A-1 (0.1) | 2-(trichloromethyl)-4-(4-trifluoromethylphenyl)-6-(trichloromethyl)-1,3,5-triazine (0.1) | 7 | 7 |
| 28 | I-13 (0.05) | A-3 (0.1) | II-1 (0.1) | 7.5 | 7.5 |
| 29 | I-13 (0.05) | A-2 (0.1) | III-6 (0.2) | 7.5 | 7.5 |
| 30 | I-13 (0.1) | A-3 (0.2) | 2-mercaptobenzothiazole (0.4) | 7 | 6.5 |

TABLE 2-continued

| | Sensitizing Dye | Titanocene Compound | Compounds (1) to (8) | Gray Scale Stage Number Immediately After Produced (Clear) | Gray Scale Stage Number After Storage at 50° C., 3 Days (Clear) |
|---|---|---|---|---|---|
| 31 | I-13 (0.1) | A-1 (0.15) | 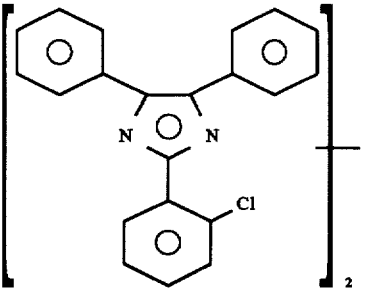 (0.5) | 7 | 7 |
| 32 | I-13 (0.1) | A-3 (0.2) | 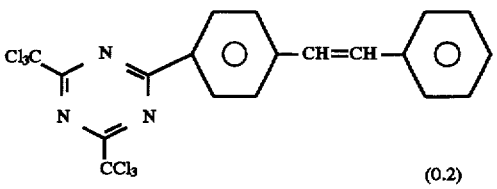 (0.2) | 7.5 | 7.5 |
| 33 | I-13 (0.1) | A-2 (0.2) | II-3 (0.4) | 7.5 | 7.5 |
| 34 | I-13 (0.05) | A-1 (0.2) | III-9 (0.4) | 7.5 | 7.5 |
| 35 | I-13 (0.05) | A-1 (0.1) | 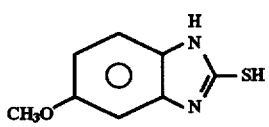 (0.2) | 7.5 | 7 |
| 36 | I-13 (0.05) | A-1 (0.1) | 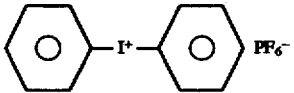 (0.2) | 7.5 | 7 |
| Comparative Example No. | | | | | |
| 8 | Comparative Dye a (0.1) | A-1 (0.2) | II-1 (0.2) | 0 | |

The results in Tables 1 and 2 show that the photopolymerizable compositions of the present invention containing a sensitizing dye represented by formula (I) and a titanocene compound as a photopolymerization initiation system have high sensitivity.

Also, higher sensitivity can be obtained by using a compound represented by formulae (1) to (8) in combination. On the other hand, if only one of the sensitizing dye and the titanocene compound is contained in the photopolymerization initiation system, or if an analogue compound which is out of the scope of the present invention is used, the effects of the present invention cannot be obtained.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising an addition-polymerizable compound having at least one ethylenic unsaturated double bond, a sensitizing dye represented by the following formula (I), and a titanocene compound having two phenyl groups:

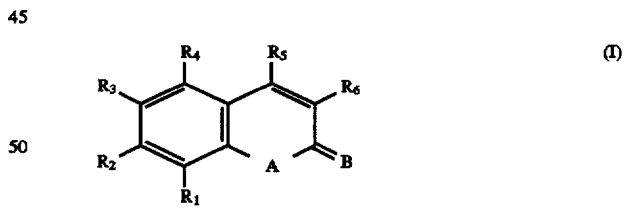

wherein $R_1$, $R_2$, $R_3$ and $R_4$ are the same or different, and each represents a hydrogen atom, a halogen atom, a substituted or unsubstituted alkyl group, a substituted or unsubstituted aryl group, a hydroxyl group, a substituted or unsubstituted alkoxy group, or a substituted or unsubstituted amino group, or $R_1$, $R_2$, $R_3$ or $R_4$ may be combined with a carbon atom in formula (I) to form a nonmetallic atom ring;

$R_5$ represents a hydrogen atom, a substituted or unsubstituted alkyl group, a substituted or unsubstituted aryl group, a substituted or unsubstituted heteroaromatic group, a cyano group, a substituted or unsubstituted alkoxy group, a carboxyl group, or a substituted or unsubstituted alkenyl group;

$R_6$ has the same meaning as $R_5$ or represents —Z—$R_5$, in which Z represents a carbonyl group, a sulfonyl group, a sulfinyl group or an arylenedicarbonyl group, or $R_5$ and $R_6$ may be combined with each other to form a nonmetallic atom ring;

A represents O, S, NH, or a nitrogen atom having a substituent; and

B represents a group represented by the following formula:

wherein $G_1$ and $G_2$ are the same or different, and each represents a hydrogen atom, a cyano group, a substituted or unsubstituted alkoxycarbonyl group, a substituted or unsubstituted aryloxycarbonyl group, a substituted or unsubstituted acyl group, a substituted or unsubstituted arylcarbonyl group, a substituted or unsubstituted alkylthio group, a substituted or unsubstituted arylthio group, a substituted or unsubstituted alkylsulfonyl group, a substituted or unsubstituted arylsulfonyl group, or a fluorosulfonyl group, provided that $G_1$ and $G_2$ are not a hydrogen atom at the same time, or $G_1$ and $G_2$ may be combined with each other to form a nonmetallic atom group together with a carbon atom.

2. The photopolymerizable composition as claimed in claim 1, which further contains at least one compound selected from the group consisting of the following compounds (1) to (8):

(1) a compound having a carbon-halogen bond;

(2) a ketone compound represented by the following formula (II):

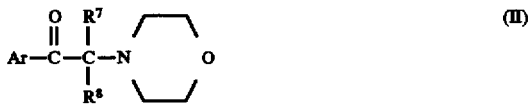

wherein $R^7$ and $R^8$ are the same or different, and each represents a hydrogen atom or a substituted or unsubstituted alkyl group, or $R^7$ and $R^8$ may be combined with each other to form a carbon ring with a carbon atom; and Ar represents an aromatic group selected from the following formulae:

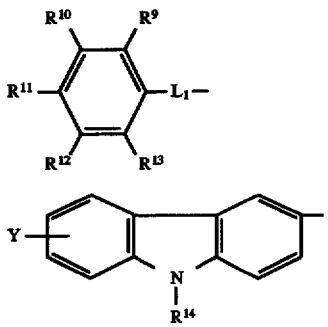

wherein $R^9$, $R^{10}$, $R^{11}$, $R^{12}$ and $R^{13}$ are the same or different, and each represents a hydrogen atom, a halogen atom, a substituted or unsubstituted alkyl group, a substituted or unsubstituted alkenyl group, a substituted or unsubstituted aryl group, a hydroxyl group, a substituted or unsubstituted alkoxy group, an —S—$R^{15}$ group, an —SO—$R^{15}$ group or an —$SO_2$—$R^{15}$ group, provided that at least one of $R^9$, $R^{10}$, $R^{11}$, $R^{12}$ and $R^{13}$ represents an —S—$R^{15}$ or —SO—$R^{15}$ group, in which $R^{15}$ represents a substituted or unsubstituted alkyl group, a substituted or unsubstituted acyl group, a substituted or unsubstituted alkenyl group or a substituted or unsubstituted aryl group;

$L_1$ represents a single bond or a substituted or unsubstituted alkylene group;

$R^{14}$ represents a hydrogen atom, a substituted or unsubstituted alkyl group or a substituted or unsubstituted acyl group; and Y represents a hydrogen atom or

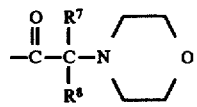

wherein $R^7$ and $R^8$ have the same meanings as the above-described $R^7$ and $R^8$;

(3) a ketoxime compound represented by the following formula (III):

wherein $R^{16}$ and $R^{17}$ are the same or different, and each represents a substituted or unsubstituted hydrocarbon group which may contain an unsaturated bond or a substituted or unsubstituted heterocyclic group;

$R^{18}$ and $R^{19}$ are the same or different, and each represents a hydrogen atom, a substituted or unsubstituted hydrocarbon group which may contain an unsaturated bond, a substituted or unsubstituted heterocyclic group, a hydroxyl group, a substituted oxy group, a mercapto group or a substituted thio group; and $R^{20}$ and $R^{21}$ are the same or different, and each represents a hydrogen atom, a substituted or unsubstituted hydrocarbon group which may contain an unsaturated bond, or a substituted carbonyl group, or $R^{20}$ and $R^{21}$ may be combined with each other to form a ring and represent an alkylene group having from 2 to 8 carbon atoms which may contain —O—, —$NR^{20}$—, —$NR^{21}$—, —O—CO—, —NH—CO—, —S—and/or —$SO_2$— in the linking main chain of the ring;

(4) an organic peroxide;

(5) a thio compound represented by the following formula (IV):

$R^{23}$ represents a hydrogen atom or a substituted or unsubstituted alkyl group, or $R_{22}$ and $R_{23}$ may be combined with each other to represent a nonmetallic atom group necessary for forming a 5-, 6- or 7-membered ring which may contain a hetero atom selected from an oxygen atom, a sulfur atom and a nitrogen atom;

(6) hexaarylbiimidazole;

(7) an aromatic onium salt; and (8) a ketoxime ester.

3. The photopolymerizable composition as claimed in claim 1, wherein the addition-polymerizable compound is a compound having at least one terminal ethylenic unsaturated bond.

4. The photopolymerizable composition as claimed in claim 1, wherein the sensitizing dye is used in an amount of from 0.05 to 30 parts by weight based on 100 parts by weight of the addition-polymerizable compound.

5. The photopolymerizable composition as claimed in claim 1, wherein the titanocene compound is used in an amount of from 0.5 to 100 parts by weight based on 100 parts by weight of the addition-polymerizable compound.

* * * * *